US007174261B2

(12) United States Patent
Gunn et al.

(10) Patent No.: US 7,174,261 B2
(45) Date of Patent: Feb. 6, 2007

(54) POWER LINE SENSORS AND SYSTEMS INCORPORATING SAME

(75) Inventors: Colin N. Gunn, Victoria (CA); Martin A. Hancock, Victoria (CA); J. Bradford Forth, Victoria (CA); Simon H. Lightbody, Victoria (CA); Jason Sheppard, Victoria (CA); Brian R. Kingham, Victoria (CA)

(73) Assignee: Power Measurement Ltd., Saanichton (CA)

( * ) Notice: Subject to any disclaimer, the term of this patent is extended or adjusted under 35 U.S.C. 154(b) by 16 days.

(21) Appl. No.: 10/803,411

(22) Filed: Mar. 18, 2004

(65) Prior Publication Data

US 2004/0183522 A1 Sep. 23, 2004

Related U.S. Application Data

(60) Provisional application No. 60/488,700, filed on Jul. 18, 2003, provisional application No. 60/455,832, filed on Mar. 19, 2003.

(51) Int. Cl.
*G01R 21/00* (2006.01)

(52) U.S. Cl. ........................................ 702/62; 324/547

(58) Field of Classification Search ............ 702/60–62, 702/64, 72, 75, 183, 185; 324/522–523, 324/538, 543, 546–547; 323/311–317; 361/601–603
See application file for complete search history.

(56) References Cited

U.S. PATENT DOCUMENTS 3,153,758 A 10/1964 Kusters et al. .............. 324/726

(Continued)

FOREIGN PATENT DOCUMENTS

EP 0 395 495 A1 10/1990

(Continued)

OTHER PUBLICATIONS

W.J.M. Moore & P.M. Miljanic, "The Current Comparator," *IEE Electrical Measurement Series 4*, 1988, London.

(Continued)

*Primary Examiner*—Marc S. Hoff
*Assistant Examiner*—Mary Catherine Baran
(74) *Attorney, Agent, or Firm*—Brinks Hofer Gilson & Lione

(57) ABSTRACT

An apparatus for sensing the current in a power line of a power system and systems incorporating the apparatus are disclosed. The apparatus may comprise an enclosure providing a window operable to permit the passage of the power line therethrough. The apparatus may further comprise an active current transformer set within the enclosure and operative to produce a scaled version of the current. The apparatus may further comprise an amplifier coupled with the active current transformer and operative to reduce the phase shift and ratio error between the current and the scaled version of the current. The apparatus may further comprise a powering current transformer set within the enclosure and operative to receive power from the power line on a primary winding and deliver power on a secondary winding. The apparatus may further comprise power supply circuitry set within the enclosure, the power supply circuitry powered through the secondary winding from the powering current transformer and operative to supply power to the amplifier. The apparatus may further comprise at least one of secondary leads and secondary terminals extending from the enclosure, coupled with the active current transformer and operative to deliver the scaled version of the current outside of the enclosure.

18 Claims, 15 Drawing Sheets

120
A B C N
20
230
210
I1
I2
I3
I4
250
200
IED2
V1
V2
V3
260
220
240
99
Br
130
Load
580

U.S. PATENT DOCUMENTS 3,534,247 A 10/1970 Miljanic ..................... 323/357
4,255,704 A 3/1981 Milkovic .................... 324/127
4,422,039 A 12/1983 Davis ......................... 324/119
4,629,974 A 12/1986 Friedl ......................... 323/357
4,709,339 A 11/1987 Fernandes ................... 700/293
4,841,236 A 6/1989 Miljanic et al. ............ 324/127
4,884,038 A 11/1989 Miljanic ..................... 330/165
4,967,145 A 10/1990 Davies ....................... 324/127
5,066,904 A 11/1991 Bullock ...................... 324/127
5,276,394 A 1/1994 Mayfield .................... 323/356
5,307,008 A 4/1994 So ............................. 323/357
5,563,506 A 10/1996 Fielden et al. .............. 324/142
5,644,514 A 7/1997 Abo et al. .................. 702/124
5,650,936 A 7/1997 Loucks et al. ................ 702/62
5,673,252 A 9/1997 Holowick et al. .......... 370/449
5,684,466 A 11/1997 Keating et al. ............. 340/662
5,809,045 A * 9/1998 Adamiak et al. ........... 714/799
5,959,818 A 9/1999 Blakely ..................... 361/93.5
5,995,911 A 11/1999 Hart ............................ 702/64
6,005,759 A 12/1999 Hart et al. .................... 361/66
6,018,700 A 1/2000 Edel ............................ 702/60
6,046,582 A 4/2000 Sanelli et al. ............... 324/126
6,278,357 B1 8/2001 Croushore et al. ...... 340/310.01
6,292,717 B1 * 9/2001 Alexander et al. .......... 700/293
6,373,834 B1 4/2002 Lundh et al. ............... 370/350
6,385,022 B1 5/2002 Kulidjian et al. ............. 361/62
6,397,155 B1 5/2002 Przydatek et al. ............ 702/61
6,417,661 B1 7/2002 Berkcan et al. ......... 324/117 R
6,433,981 B1 8/2002 Fletcher et al. ............ 361/93.1
6,470,283 B1 10/2002 Edel ............................ 702/64
6,493,644 B1 12/2002 Jonker et al. ................. 702/61
6,571,182 B2 * 5/2003 Adamiak et al. ............. 702/64
6,590,891 B1 7/2003 Jacquet et al. .............. 370/350
2001/0010032 A1 * 7/2001 Ehlers et al. ................. 702/62
2002/0027504 A1 3/2002 Davis et al. ................ 340/540
2002/0032535 A1 * 3/2002 Alexander et al. ............ 702/64
2002/0091784 A1 7/2002 Baker et al. ................ 709/221
2002/0120723 A1 8/2002 Forth et al. ................. 709/208
2003/0067725 A1 4/2003 Horvath et al. ............... 361/65
2003/0098679 A1 5/2003 Odaohhara .................. 323/284

FOREIGN PATENT DOCUMENTS

EP 0 957 607 A1 11/1999
WO WO 01/59965 A1 8/2001

OTHER PUBLICATIONS

The Institute of Electrical and Electronics Engineers, Inc., "IEEE Standard Requirements for Instrument Transformers," *IEEE Std C57*. 13-1993, New York.

International Search Report, PCT/CA2004/000705, dated Aug. 20, 2004.

PCT International Search Report for Application No. PCT/US04/23006.

* cited by examiner

COMM
I/O
DISP
uC
PS
COMM Interface Circuitry
PS
I1
I2
I3
I4
V1
V2
V3
540
550
580
590
530
560
510
600
690
210
250
260

COMM
I/O
DISP
uC
PS
A/D
Analog Cond Circuitry
I11
I12
I21
I22
I31
I32
I41
I42
V1
V2
V3
Vn
540
550
580
590
530
560
510
520
500
110
140
170

POWER LINE SENSORS AND SYSTEMS INCORPORATING SAME

RELATED APPLICATIONS

The present patent document claims the benefit of the filing date under 35 U.S.C. §119(e) of Provisional U.S. Patent Application Ser. No. 60/455,832, filed Mar. 19, 2003, and Provisional U.S. Patent Application Ser. No. 60/488,700, filed Jul. 18, 2003 which are hereby incorporated by reference.

The following co-pending and commonly assigned U.S. Provisional Patent Application has been filed on the same date as the present application. This application relates to and further describes other aspects of the embodiments disclosed in the present application and is herein incorporated by reference:

U.S. Provisional Pat. Application Ser. No. 60/554,188, "Non-intrusive energy sensor with wireless communications".

BACKGROUND

The invention relates generally to the field of current sensors used for monitoring current flow in power systems. More specifically the invention relates to a self powered or remotely powered current sensor device providing an output signal.

Intelligent Electronic Devices (IEDs) comprise, but are not limited to digital power/energy meters, protective relays, power quality measurement devices, fault recorders or other devices capable of interfacing to electric power lines and calculating at least one power parameter. Power parameters include, but are not limited to rms current, rms voltage, kW, kVAR, kVA, frequency, harmonics, kWh, kVARh, kVAh, symmetrical components, etc.

Current transformers are used to monitor the current flowing in power system conductors. Generally, current transformers consist of two types. The first type is the closed (toroidal or rectangular) type. The second type is the clamp-on type. The closed type consists of a toroidal or substantially rectangular section of magnetic material with a "window" or opening through the middle. The current transformers have at least one secondary transformer winding that is wound around the material and through the window. A primary winding normally consists of a power line in a power system passing through the window that forms a single transformer turn. The winding ratio of the transformer is then the ratio of the primary to secondary turns. Clamp-on type current transformers are of substantially the same shape as closed type current transformers with the addition of a split in the magnetic material such that the transformer can be placed around the primary winding without having to "thread" the primary winding through the window. This allows installation of the clamp-on type current transformer on power system cables without disconnecting the power system cables from their source or load.

Standard current transformers suffer from errors in both ratio and phase shift mainly due to the magnetization current required to excite the magnetic material of the core. These effects limit the accuracy of the current transformer and dynamic range of current the transformers are able to sense. This is especially the case with clamp-on type current transformers due to the magnetic flux leakage caused by the split in the magnetic material.

An active or compensated current transformer circuit that corrects for such errors is described in U.S. Pat. No. 3,534,247 to Miljanic entitled "Current Transformer with Internal Error Compensation." This circuit minimizes phase shift and ratio error during current transformation using a compensation amplifier. Powering the compensation amplifier from an additional current transformer is included in the active current transformer circuit. The presence of a separate powering current transformer means that additional wires are present beyond those providing the secondary current. This may make the device undesirable for installation in locations such as switchgear cabinets due to the high voltages present.

A second active current transformation approach is described in U.S. Pat. No. 4,841,236 to Miljanic et al. entitled "Current Ratio Device." This approach provides additional isolation over the approach of the U.S. Pat. No. 3,534,247 through the inclusion of an isolated additional secondary winding which provides advantages for uses in high accuracy metrology applications. In general the accuracy of the approach of the U.S. Pat. No. 3,534,247 is more than adequate for most power system monitoring applications.

A self powered current monitor for monitoring current in an electric power system is described in U.S. Pat. No. 6,018,700 to Edel entitled "Self-Powered Current Monitor." This circuit provides power for amplification circuitry, a microprocessor, etc. that is derived from the power line that is being monitored. The circuit includes a burden reducing circuit. The burden reducing circuit allows current monitoring to be performed with the same magnetic core that is powering the circuitry. The monitoring function of this circuit is not continuous or in alternate embodiments the burden of the power supply reduces the accuracy of the current transformation. Accordingly, this approach is difficult to use with accurate advanced power monitoring devices that continuously sample the current waveform in order to provide accurate power calculations and power quality functionality.

Intelligent Electronic Devices ("IEDS") are available from multiple manufacturers. These IEDs commonly have current sensing inputs which accept current inputs from standard current transformers in the 5 Amp range. These current sensing inputs are typically two terminals. Two cables extend from the current transformers for connection to the terminals. Additional wiring of power supplies or separate powering cores as required by the previously described active current transformers is undesirable due to increased cost of installation, compliance with electrical codes, etc.

DETAILED DESCRIPTION OF THE PRESENTLY PREFERRED EMBODIMENTS

Herein, the phrase "coupled with" is defined to mean directly connected to or indirectly connected through one or more intermediate components. Such intermediate components may include both hardware and software based components.

The present invention relates to a current sensor and a power monitoring and control system that includes the sensor. The current sensor can replace a traditional current transformer in that it appears to the user and is usable the same way as a conventional current transformer while providing increased accuracy and dynamic range. For improved compatibility with standard current transformers the current sensor may have only two leads exiting its enclosure, and is intended to surround a current carrying conductor and sense the current flowing in the conductor. The current sensor may have at least one of decreased phase shift, decreased ratio error, decreased size and increased dynamic range when compared to typical current transformers. In addition, the current sensor may be self-powered.

In an alternate example, the current sensor may provide a digital communication link exiting its enclosure instead of analog current leads. This communication link can be used with intelligent electronic devices (WEDs) that do not have analog current and/or voltage inputs to implement a power monitoring and control system. The communication link may be wired, wireless or fiber optic. In this example the current sensor may be self powered, or powered over the cabling of the communication link.

Figure 1:
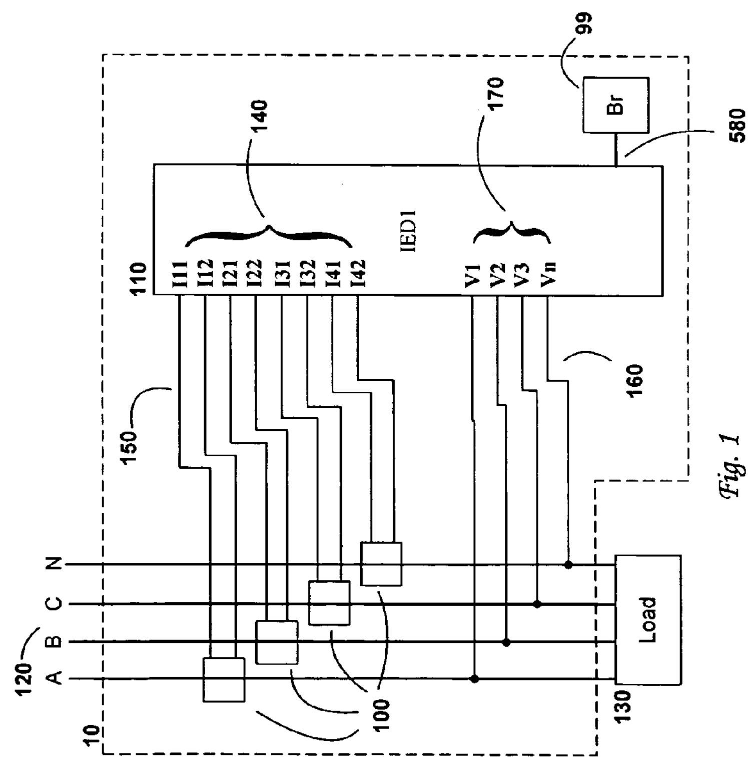
FIG. 1 depicts a block diagram of a first embodiment of a plurality of current sensors of the present invention in a first embodiment of a power monitoring system of the present invention.

Referring now to FIG. 1, an example of a plurality of current sensors is shown in a power monitoring system 10. In this first example, each of the current sensors will be referred to as an analog sensor 100 since the outputs from the analog sensor 100 contain secondary current in analog form. A plurality of analog sensors 100 are coupled with power lines 120 which deliver power to a load 130 in a power system. The illustrated power lines 120 and load 130 are part of a three phase power system however; single phase, phase-to-phase or any other power system configuration is possible in other examples. The analog sensors 100 produce a scaled version of the current flowing in the power lines 120. The scaled version is provided to a plurality of current inputs 140 of an IED 110 through current conductors 150.

The IED 110 may also have a plurality of voltage inputs 170 which are coupled with the power lines 120 through voltage conductors 160 in order that the IED 100 can sense the voltage on the power lines 120. Those skilled in the art will appreciate that depending on the voltage on the power lines 120 it may be necessary to install potential transformers (PTs) between the power lines 120 and the voltage inputs 170 in order that the voltage supplied to the voltage inputs 170 is within the specifications of the IED 110. The IED 110 may be any device(s) capable of providing monitoring, recordation, relaying, or any other power system related functionality using the current information provided by the current sensor. The model ION7350 Digital Power Meter manufactured by Power Measurement Ltd. located in Saanichton, B.C., Canada, represents one embodiment of the IED 110.

Figure 2:
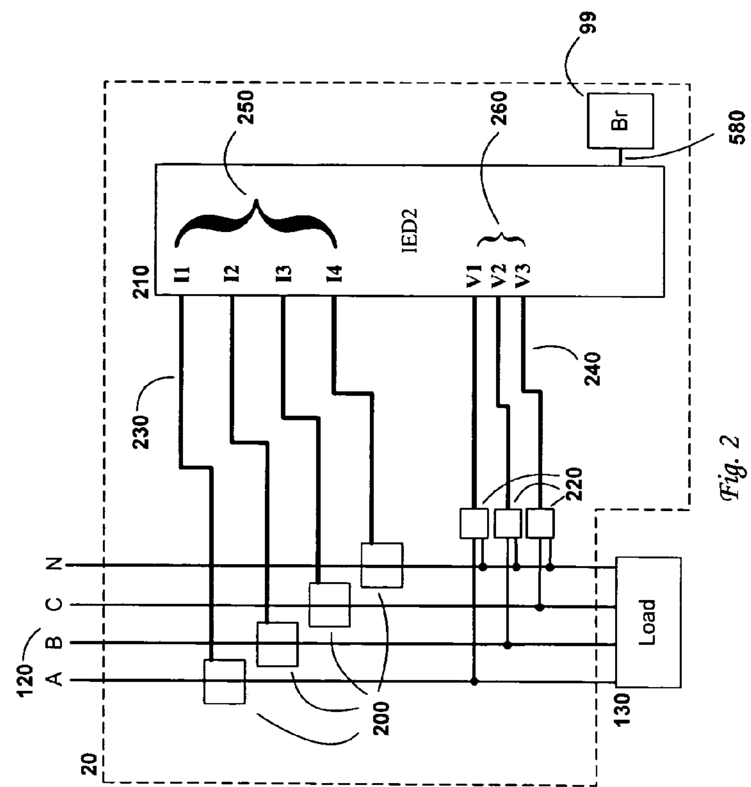
FIG. 2 depicts a block diagram of a second embodiment of the current sensors of the present invention in a second embodiment of the power monitoring system of the present invention.

Referring now to FIG. 2, a second example of the current sensors is shown in a power monitoring system 20. This second embodiment of the current sensor will be referred to as a digital sensor 200 as the outputs from the sensor contain secondary current information in digital form. Digital sensors 200 are coupled with power lines 120, which deliver power to a load 130 in a power system. The digital sensors 200 communicate packets containing data indicative of the current flowing in power lines 120. The communication packets may be delivered to a plurality of current communications ports 250 of an IED 210 through current communications cabling 230. Current communications cabling 230 may be wire, fiber optic cabling and/or any other medium capable of transmitting data.

The IED 210 may also have a plurality of voltage communications ports 260 which are coupled with a respective plurality of digital voltage sensors 220. The digital voltage sensors 220 include circuitry operative to sample at least one voltage and communicate the sample. The digital voltage sensors 220 are coupled with the power lines 120 and produce voltage communications packets containing data indicative of the voltage on the power lines 120. The communications packets are received by the voltage communications ports 260 over voltage communications cabling 240. Voltage communications cabling 240 may be wire, fiber optic cabling and/or any other medium capable of transmitting data. Those skilled in the art will appreciate that separate communications ports for each voltage or current may not be necessary depending on the communications architecture used. In addition, digital sensors 200 and digital voltage sensors 220 may be combined into single enclosures with a single communications port where installation requirements allow.

Figure 4:
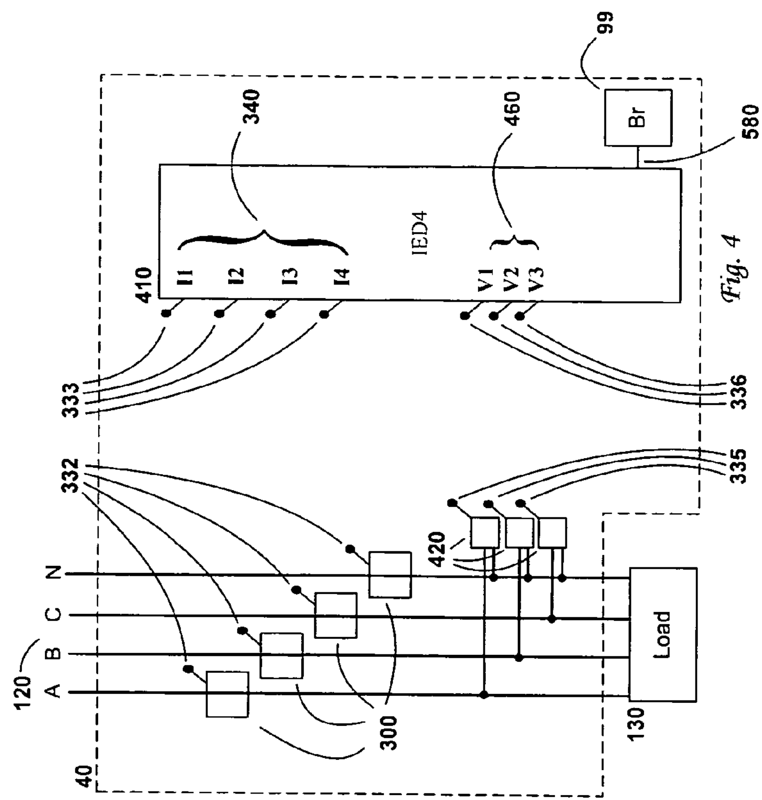
FIG. 4 depicts a block diagram of the third embodiment of the current sensors of the present invention in a fourth embodiment of the power monitoring system of the present invention.
Figure 3:
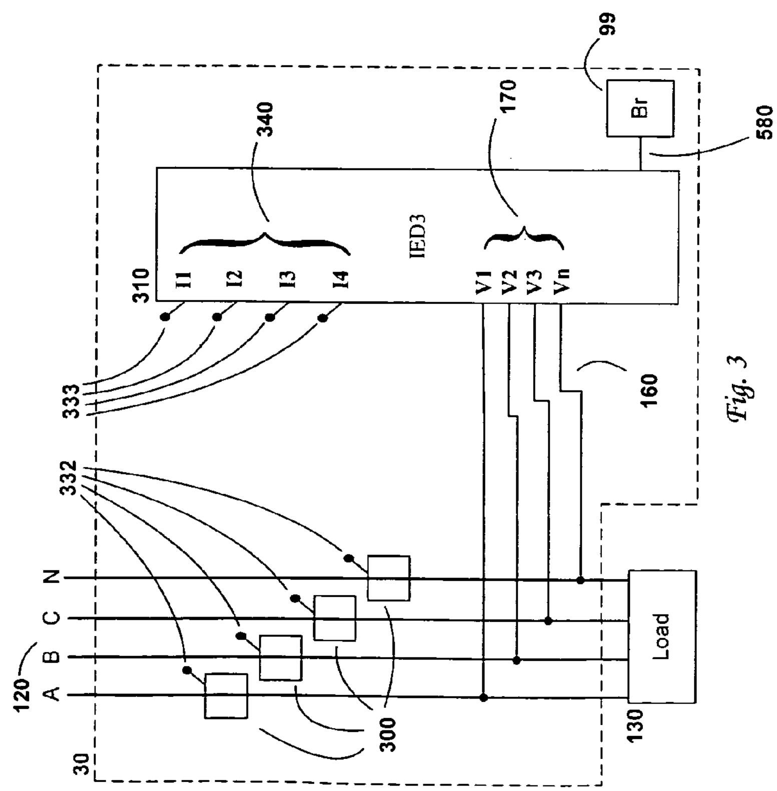
FIG. 3 depicts a block diagram of a third embodiment of the current sensors of the present invention in a third embodiment of the power monitoring system of the present invention.

Referring now to FIGS. 3 and 4, additional examples of the current sensors of the present invention are shown in power monitoring systems 30 and 40. These examples of the current sensor will be referred to as a wireless sensor 300 since the outputs are communicated through a plurality of antennas 332 to a plurality of respective current receiving antennas 333 on IEDs 310 and 410. Wireless sensors 300 are coupled with power lines 120 which deliver power to a load 130 in a power system. The wireless sensors 300 communicate wireless packets containing data indicative of the current flowing in power lines 120 through one or more wireless radio frequency (RF) channels. The wireless packets may be delivered to the current receiving antennas 333 which are coupled with a plurality of current RF communications ports 340 of the IEDS 310, 410. Control and other data necessary to enable the communications may flow from the current receiving antennas 333 to the antennas 332 on the wireless sensors 300 which include wireless transceivers. Wireless sensors 300 and IEDs 310, 410 may form part of an RF mesh network.

IED 310 has voltage inputs 170 similar to those of IED 110. IED 410 has a plurality of wireless voltage sensors 420. The wireless voltage sensors 420 are coupled with antennas 335 to voltage receiving antennas 336. Voltage RF communications ports 460 receive the data from the wireless voltage sensors 420. The wireless voltage sensors 420 are coupled with the power lines 120 and produce wireless packets containing data indicative of the voltage on the power lines 120. Those skilled in the art will appreciate that separate antennas and communications ports for each voltage or current may not be necessary depending on the communications architecture used. In addition, wireless sensors 332 and wireless voltage sensors 420 may be combined into single enclosures with a single antenna.

Figures 5, 6:
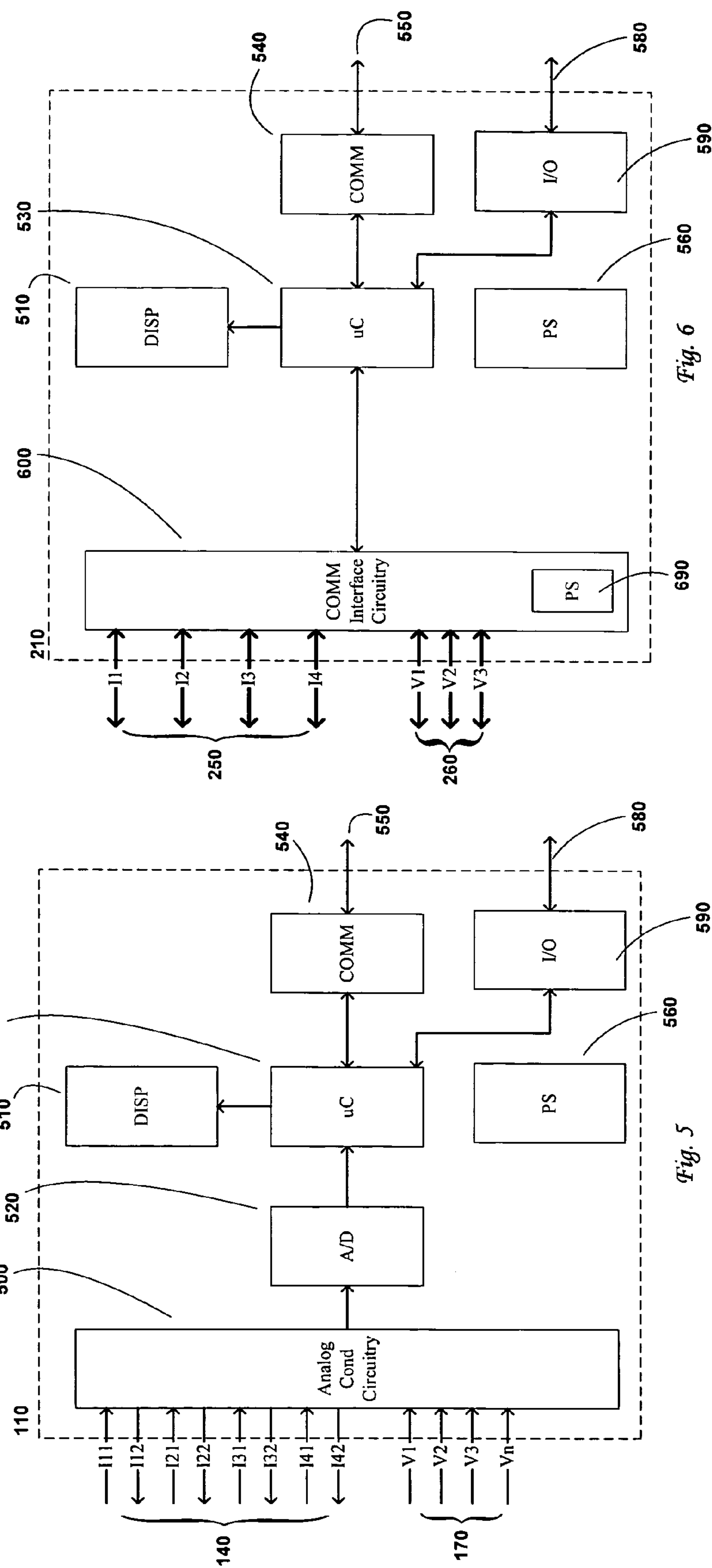
FIG. 5 depicts a block diagram of the internal circuitry of a first embodiment of an IED of the present invention.
FIG. 6 depicts a block diagram of the internal circuitry of a second embodiment of the IED of the present invention.

Referring now to FIG. 5, a block diagram of the internal circuitry of an example of the IED 110 is shown. Current and voltage signals enter current and voltage inputs 140 and 170, respectively. Analog conditioning circuitry 500 may convert the relatively high current and voltage signals to lower voltage signals (proportional to the high current and voltage signals) appropriate for input to analog to digital converter (A/D) 520. The analog conditioning circuitry 500 may also perform any other conditioning, scaling, processing, etc. needed to provide signals compatible with the internal circuitry of the IED 110. Microcontroller 530 receives an output from the A/D 520 that is a digital representation of the current and voltage signals. The microcontroller 530 may be any form of processing computer device capable of executing instructions to control the overall operation of the IED 110. Microcontroller 530 may compute various power parameters such as rms current, rms voltage, kW, kVAR, kVA, frequency, harmonics, kWh, kVARh, kVAh, etc. based on the current and voltage signals and may store these computations in internal or external memory. Microcontroller 530 may provide at least some of the power parameters to display 510 and through communications interface circuitry 540 to communications bus 550. Communications bus 550 may be coupled with a computer or other device with communication capability that may retrieve power parameters from the IED 110 and transmit or receive other information useful in the operation of the IED 110. Power supply 560 provides power to the various circuits in IED 110. Power supply 560 may be provided with power from power lines 120 (FIG. 1) or any other appropriate power source.

Referring now to FIG. 6, a block diagram of the internal circuitry of an example of the IED 210 is shown. Data indicative of current and voltage enters current communications ports 250 and voltage communications ports 260 respectively. Communications interface circuitry 600 receives the data and makes the data available to microcontroller 530. Communications interface circuitry 600 may comprise any circuitry operative to send and receive data in a packetized form. Microcontroller 530 may compute various power parameters such as rms current, voltage, kW, kVAR, kVA, frequency, harmonics, kWh, kVARh, kVAh, etc. based on the current and voltage signals, and may store the results of computations in internal or external memory. Microcontroller 530 provides at least some of the power parameters to display 510 and through communications interface circuitry 540 to communications bus 550. Communications bus 550 may be coupled with a computer that retrieves the power parameters from the IED 210, and transmits or receives other information useful in the operation of the IED 210. Power supply 560 provides power to the various circuits in IED 210. Power supply 560 may be provided with power from power lines 120 or any other appropriate power source. Communications interface circuitry 600 also may contain power multiplexing circuitry 690 that multiplexes power on the current communications ports 250 and thus communications cabling 230 (FIG. 2) such that the digital sensors 200 may receive operational power from the IED 210.

Figure 7:
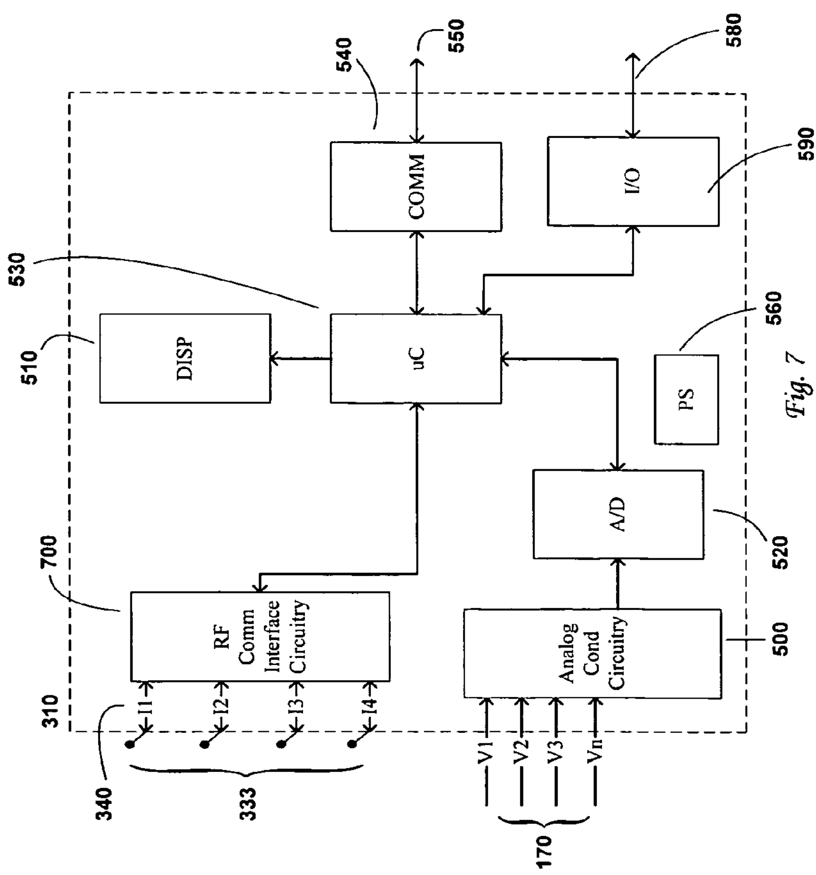
FIG. 7 depicts a block diagram of the internal circuitry of a third embodiment of the IED of the present invention.

Referring now to FIG. 7, a block diagram of the internal circuitry of an example of the IED 310 is shown. Voltage signals enter the voltage inputs 170 as previously described for IED 110 (FIG. 5). Wireless packets containing secondary current information are received through current receiving antennas 333, and current RF communications ports 340 into RF communications interface circuitry 700. RF communications interface circuitry 700 comprises any appropriate circuitry operative to transmit and/or receive data over a wireless channel. RF communications interface circuitry 700 provides data indicative of the current received through current RF communications ports 340 to microcontroller 530. The analog conditioning circuitry 500 may provide analog voltage information to the microcontroller 530 via the A/D converter 520 as previously discussed. Microcontroller 530 may compute various power parameters such as rms current, voltage, kW, kVAR, kVA, frequency, harmonics, kWh, kVARh, kVAh, etc. based on the current and voltage signals. Microcontroller 530 may provide at least some of the power parameters to display 510 and through communications interface circuitry 540 to communications bus 550. Communications bus 550 may be connected to a computer which retrieves the power parameters from the IED 310 and may send or receive other data necessary for operation of the IED 310 or system. Power supply 560 provides power to the various circuits in IED 210. Power supply 560 may be provided with power from power lines 120 or any other appropriate power source.

Figure 8:
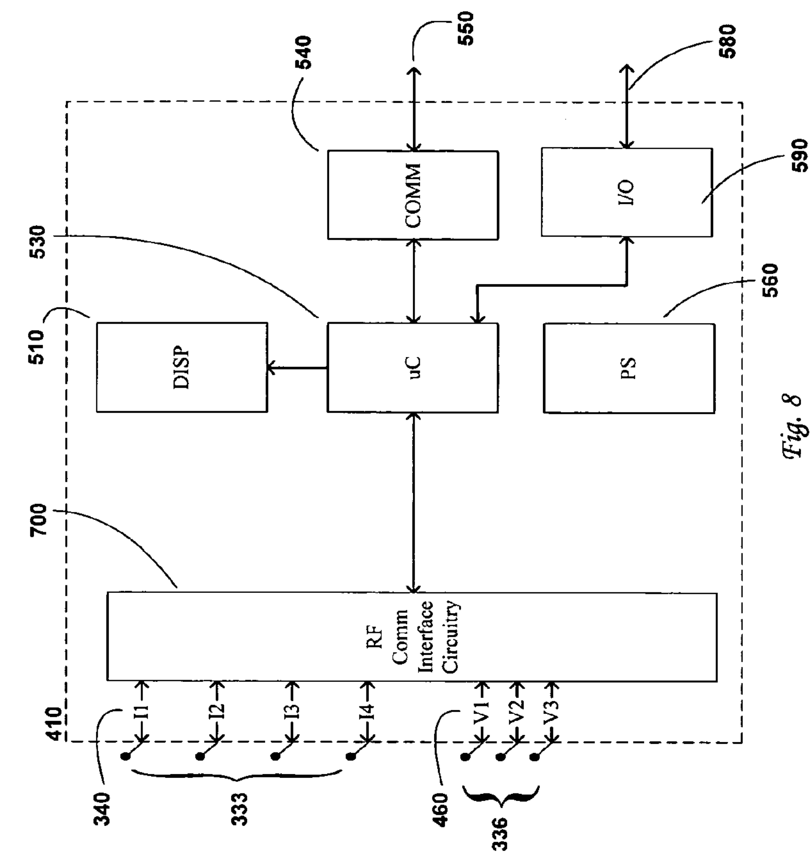
FIG. 8 depicts a block diagram of the internal circuitry of a fourth embodiment of the IED of the present invention.

Referring now to FIG. 8, a block diagram of the internal circuitry of an example of the IED 410 is shown. Wireless packets containing current information are received in a similar manner to IED 310 described above. Wireless packets containing voltage information are received through voltage receiving antennas 336, and voltage RF communications ports 460 into RF communications interface circuitry 700. RF communications interface circuitry 700 provides data indicative of the current and voltage to microcontroller 530. Microcontroller 530 may compute various power parameters such as rms current, voltage, kW, kVAR, kVA, frequency, harmonics, kWh, kVARh, kVAh, etc. based on the current and voltage signals and may store the result of these computations in internal or external memory. Microcontroller 530 may provide at least some of the power parameters to display 510 and through communications interface circuitry 540 to communications bus 550. Communications bus 550 may be coupled with a computer that retrieves the power parameters from the IED 410 and may send or receive other data necessary for operation of the IED 410. Power supply 560 provides power to the various circuits in IED 410. Power supply 560 may be provided with power from power lines 120 or any other appropriate power source.

In FIGS. 9–13 and the following description, a particular example of the analog sensor 100 will be described. This particular example functions as a 1000:5 current sensor indicating that a 1000 A primary current will be transformed to a 5 A secondary current. It will be appreciated that with appropriate modifications (such as core sizes, turns ratios, component values and component types) other current transfer ratios are possible including, but not limited to, nominal primary currents from 50 to 20,000 Amps and nominal secondary currents between 1 and 20 Amps. In addition, it will be appreciated that with modifications evident from the preceding discussion, the other examples of the current sensors can be realized including the digital sensor 200 and wireless sensor 300.

Figure 9:
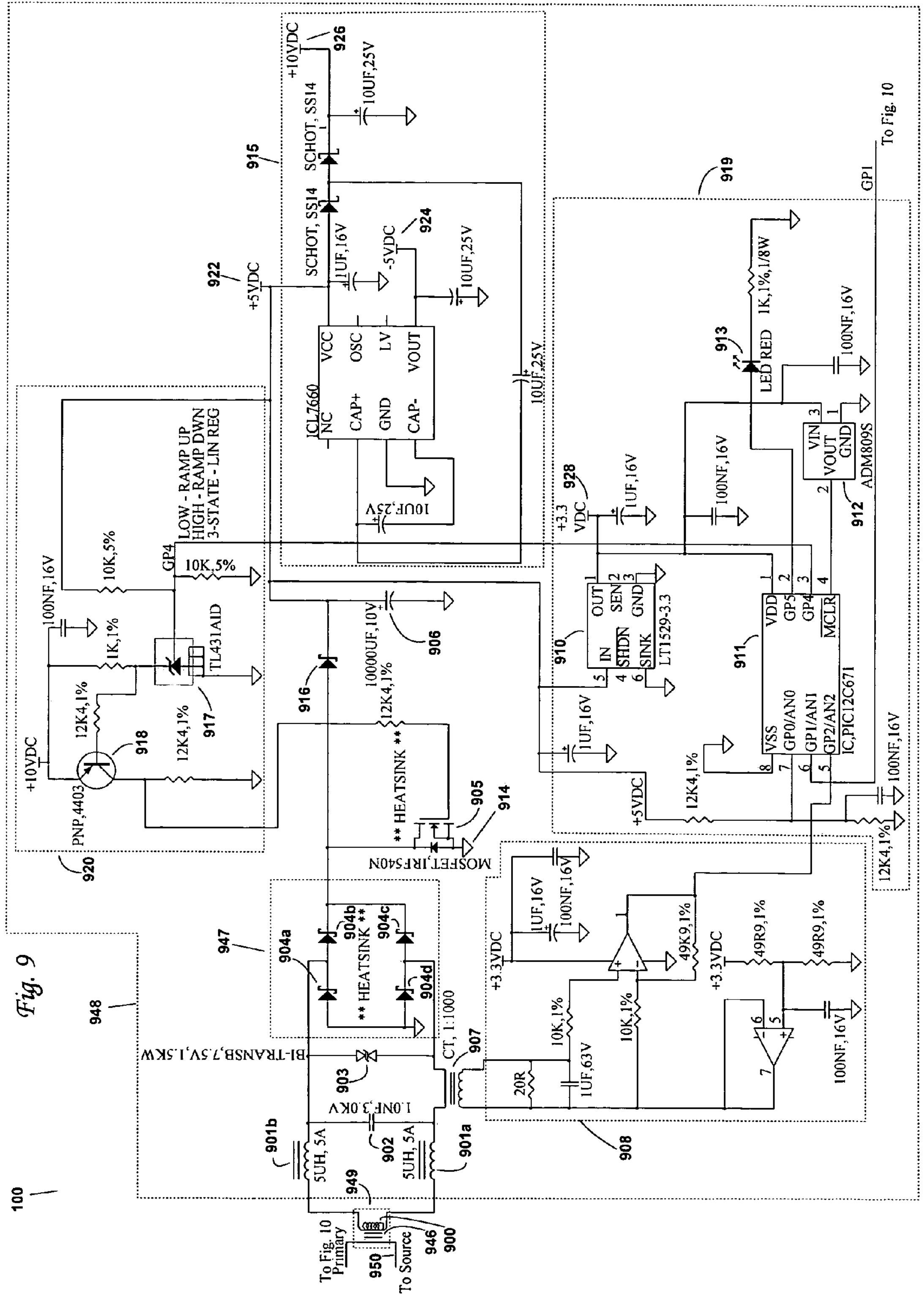
FIGS. 9 and 10 depict schematic diagrams of the electronic circuitry of a first embodiment of the current sensor of the present invention.
Figure 10:
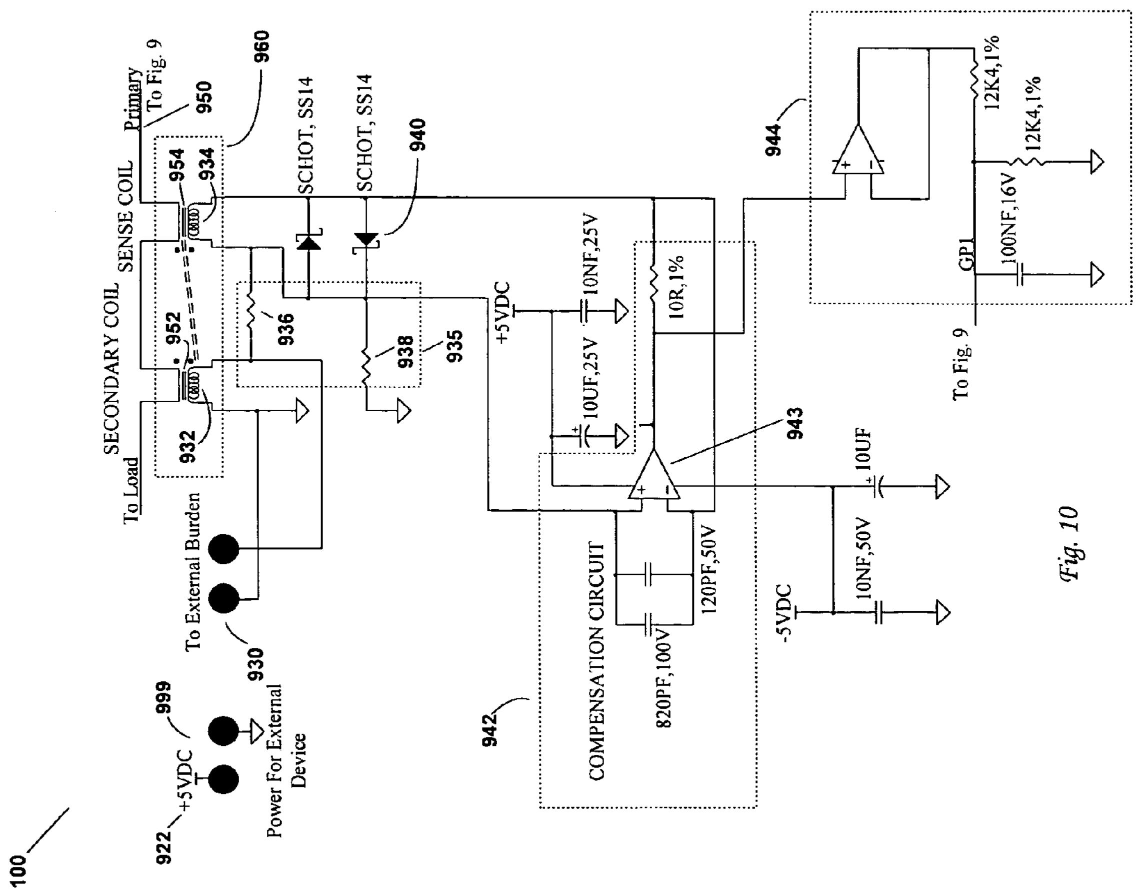

Referring now to FIGS. 9 and 10, schematic diagrams of an example of the electronic circuitry of the analog sensor 100 of the present invention are shown. It will be noted by those skilled in the art that although specific values and parts for many components have been indicated, the invention is not limited to those particular values or parts. The analog sensor 100 includes a powering current transformer (CT) 949. The illustrated powering CT 949 comprises a power core 946 and a power coil 900. A primary winding 950 passes through the power core 946 upon installation of the analog sensor 100. The power coil 900 may have a determined number of turns of a particular gauge of wire, such as 200 turns of 14 AWG gauge wire. The core materials of power core 946 may be formed from laminations, such as, 0.007 inch M2 Grade silicon steel laminations, ferrite material such as FerroxCube 3E6 ferrite material, or any other type of appropriate core material. The power core 946 may be magnetized by primary current flowing in the primary winding 950 to produce an output current from the power coil 900.

Output current from the power coil 900 is provided to power supply circuitry 948. Within the power supply circuitry 948, the output current passes through a first and second inductor 901*a* and 901*b*, a power coil sensing CT 907 and a bridge rectifier 947 formed by a plurality of diodes 904*a*, 904*b*, 904*c*, 904*d*, such as the illustrated Schottky diodes. A capacitor 902 and transorb 903 may be provided for transient protection of the circuitry.

A secondary current produced by power coil sensing CT 907 passes into current monitoring circuitry 908. The current monitoring circuitry 908 may be any circuit that provides a voltage signal that is proportional to the current flowing through power coil 900. The voltage signal is provided to microcontroller circuitry 919.

Microcontroller circuitry 919 may comprise circuitry for the operation of a microcontroller 911 such as a linear regulator 910. The microcontroller 911 may be any processor capable of processing the given inputs and outputs at an appropriate rate. Instructions in the form of code that is stored in a memory device (in the illustrated embodiment within the microcontroller) may be executed by the microcontroller 911 to perform the described functionality. One example microcontroller 911 is the model PIC12C671 manufactured by Microchip Technology Inc. located in Chandler, Ariz., U.S.A. The voltage signal provided by the current monitoring circuitry 908 may be fed to an A/D input of the microcontroller 911.

During operation, rectified current flowing from the bridge rectifier 947 may split between a MOSFET 905 and a diode 916 (such as a Schottky diode) during a linear regulation mode. When conducting, the MOSFET 905, or shunt switch, operates as a shunt to carry at least a portion of the output current of the power coil 900 to ground via a ground connection 914. The diode 916, operates to provide at least a portion of the output current of the power coil 900 to power the circuitry of the analog sensor 100 as herein described. It will be appreciated that other semiconductor device(s) capable of switching current on and off and modulating current may also be usable with appropriate circuit modifications in place of the MOSFET 905, including bipolar transistors, SCRs, TRIACs, etc. In addition, device (s) other than a Schottky diode may be used to perform the function of the diode 916.

Alternatively, during operation substantially all of the rectified current may flow through one of the MOSFET 905 or the diode 916 during a switched regulation mode. Selection of an operating mode may be controlled by the microcontroller 911. In the linear regulation mode, voltage regulation is performed by shunt regulation circuitry 920. In switched regulation mode, voltage regulation is performed by microcontroller 911. Shunt regulation circuitry 920 is a regulator that may be any circuit capable of performing as a voltage regulator in the linear regulation mode, and capable of being directed by the microcontroller during the switched regulation mode as described herein.

During the switch regulation mode, the path of the output current flow is controlled through the shunt regulation circuitry 920. When microcontroller 911 drives line GP4 high (approximately 3.3VDC in the illustrated example), MOSFET 905 is activated by the shunt regulation circuitry 920 to conduct. In the illustrated example, the shunt regulation circuitry 920 includes a shunt regulator 917 and a transistor 918. The shunt regulator 917 may be a linear shunt regulator such as a TL431 from Texas Instruments of Dallas, Tex. In other examples, any other circuit components and/or devices may perform the described functionality. In the example configuration, when line GP4 is driven high, shunt regulator 917 turns transistor 918 on. Activation of transistor 918 activates the MOSFET 905 to turn on completely (by applying approximately 10VDC to the gate of the MOSFET in the illustrated example) and virtually all current from the bridge rectifier 947 is shunted through MOSFET 905 to ground 914.

When the microcontroller 911 drives line GP4 low (approximately 0VDC in the illustrated example), shunt regulator 917 turns transistor 918 off. Deactivation of transistor 918 in turn deactivates the MOSFET 905 by applying about 0VDC to the gate of the MOSFET 905 in the illustrated example. When the MOSFET 905 is turned off (or open), and is non-conducting, virtually all current from the bridge rectifier 947 flows thorough diode 916. Microcontroller 911 may selectively switch line GP4 between high and low states to maintain regulation of a supply rail 922, as will be described herein. The switching of the MOSFET 905 between an on state (conducting) and an off state (non-conducting), or an open and a closed state, is referred to as the switched regulation mode. Those skilled in the art will appreciate that the term "on" or "closed" means that a relatively large, or a maximum, amount of current flows through the device while the term "off" or "open" means that a relatively small, or a minimum, amount of current flows through the device.

During the linear regulation mode, the microcontroller 911 converts line GP4 into an input (allows it to float). In the illustrated example, line GP4 floats to a voltage of approximately half of the supply rail 922. This causes shunt regulation circuitry 920 to operate in the linear regulation mode. In the linear regulation mode, transistor 918 dynamically modulates the gate voltage of MOSFET 905 to regulate the division of the current flow through MOSFET 905 and diode 916. The current flow through the MOSFET 905 is dynamically regulated by dynamically adjusting the conductivity of the MOSFET 905 between being on (or fully closed) and being off (or fully open).

Regulation of the current flow divided between MOSFET 905 and diode 916 allows the supply rail 922 to be substantially maintained at a determined supply rail voltage, such as about +5VDC. It will be noted that when primary current is first applied to the analog sensor 100, the circuitry will operate in the linear regulation mode until the microcontroller 911 comes out of reset and begins executing code. The circuitry will operate in linear regulation mode since the GP4 line is configured as an input during microcontroller 911 startup. This ensures that the supply rail voltage on the supply rail 922 will ramp up when power is first applied.

Current flowing through diode 916, flows into the supply rail 922. In switched regulation mode, the majority of this current charges energy storage device 906 when the MOSFET 905 is turned off. Energy storage device 906 may be any energy storage device, such as a bulk capacitor and/or a 1 Farad Supercapacitor such as the Model PB5R0V105 manufactured by PowerStor™, a division of Cooper Technologies, located in Boynton Beach, Fla. The Supercapacitor is designed to allow the analog sensor 100 to continue operation for a significant period of time when the current in primary winding 950 is too low to provide sufficient power for operation.

The supply rail 922 is provided to switched capacitor circuitry 915. The switched capacitor circuitry 915 generates a negative rail voltage on a negative rail 924 and a positive rail voltage on a positive rail 926 of about −5VDC and +10VDC, respectively, in the illustrated example. The supply rail 922 also provides power to microcontroller circuitry 919, compensation circuitry 942 and compensation overload detection circuitry 944 (FIG. 10). The negative rail 924 similarly provides power to compensation circuitry 942 and compensation overload detection circuitry 944. The positive rail 926 is used to drive the gate of the MOSFET 905 using the shunt regulation circuitry 920.

Microcontroller circuitry 919 may include a linear regulator 910 that produces a determined controller voltage, such as 3.3VDC on a controller voltage rail 928 to power the microcontroller 911 and current monitoring circuitry 908. An example linear regulator is an LT1529-3.3 made by Linear Technology Corporation of Milipitas, Calif. In addition, a voltage monitor 912 may be included to ensure that the microcontroller 911 does not execute instructions when the controller voltage rail 928 is not at the proper controller rail voltage. An example voltage monitor is an ADM809S made by Analog Devices Inc. of Norwood Mass. An indicator LED 913 may provide diagnostic information to the user of the analog sensor 100. Those skilled in the art will appreciate that other forms of indicating diagnostic information may also be usable.

Primary winding 950 also passes through active CT 960 (FIG. 10). The active CT 960 comprises a sense coil 934 that is wound on a sense core 954, and a secondary coil 932 that is wound on the combination of a secondary core 952 and the sense core 954. The secondary coil 932 of the active CT 960 is coupled with the burden terminals 930 which may be coupled with an external burden or load (such as, for example, an input of an IED). Upon magnetization of the secondary core 952 with the primary winding 950, the secondary coil 932 may supply a secondary current to the burden. Secondary coil 932 may have 200 turns of 14 AWG wire. Secondary core 952 may comprise 0.007 inch M2 grade silicon steel laminations or FerroxCube 3E6 ferrite material (many other core materials are also usable). Sense coil 934 may have 200 turns of 18 AWG wire. Sense core 954 may comprise 0.007 inch silicon steel laminations or FerroxCube 3E6 ferrite material (many other core materials are also usable). Upon magnetization of the primary core 952, the sense coil 934 may supply a sense current to a current divider 935 that may be included in the analog sensor 100.

The illustrated current divider 935 includes divider resistors 936 and 938. In other examples, the current divider 935 may be any other device(s) or circuit capable of dividing current. Diodes 940 (such as Schottky diodes) provide transient protection for the circuitry. When the divider resistors 936 and 938 are included, the current flowing through the sense coil 934 may be divided between the combination of divider resistor 936 and secondary coil 932 and divider resistor 938. This allows for a ratiometrically determined smaller number of windings in sense coil 934 than in secondary coil 932, while still allowing compensation as later described. This current divider 935 provides the ability to make adjustments to the compensation current in order to maintain current transformer compensation under conditions where the effective turns ratio between the sense coil 934 and secondary coil 932 is less than unity. This may happen if the sense coil 934 and secondary coil 932 are intentionally wound with a differing number of turns or if magnetization effects cause the effective turns ratio to be other than indicated by the number of turns.

Alternatively, divider resistors 936 and 938 may not be provided. Divider resistor 936 may be replaced with a short and divider resistor 938 may be replaced with an open. As a result, the effective turns ratio between sense coil 934 and secondary coil 932 may be set to unity.

Compensation circuitry 942 may replace magnetization current lost in the transformation through secondary core 952. The compensation circuitry 942 may include a compensation amplifier 943 that operates to maintain the voltage across sense coil 934 at about zero with a compensation current. The compensation current is provided to maintain the voltage at about zero by replacing the magnetization current (e.g. losses) of the secondary core 952. Replacement of the magnetizing current significantly reduces the phase shift and amplitude error during the transformation from primary current to secondary current flowing within the secondary coil 932. For further details of the operation of the active CT 960 and compensation amplifier 942 refer to U.S. Pat. No. 3,534,247 entitled "Current Transformer with Internal Error Compensation." Other active current compensation architectures may also be usable to compensate for magnetic losses in the secondary core 952 without departing from the spirit and scope of the present invention.

With all standard metering burdens defined in the IEEE C57.13-1993 standard, the active CT 960 may maintain a ratio error of less than about 0.1% and a phase shift of less than about 0.05 degrees between the primary and secondary current over a current range from at least 20 to 1000 Amps. In other words, the ratio error and phase shift may be maintained while the apparatus is operating over a dynamic range of 50 to 1 of the primary current to the secondary current. With core material and other optimizations this dynamic range may be increased to 100 to 1 or better.

Compensation overload detection circuitry 944 provides a scaled version of the voltage output from compensation circuitry 942 on line GP1 to the microcontroller 911 (FIG. 9). This allows the microcontroller 911 to detect when the compensation amplifier 943 is driving a voltage too near its power supply rail and thus may no longer be compensating for the total amount of secondary core 952 magnetization current. Microcontroller 911 may then initiate an indication to the user of this condition such as, by using LED 913.

The analog sensor 100 includes auxiliary power terminals 999. The auxiliary power terminals 999 allow a user to power an auxiliary device from at least one of the power rails generated within the analog sensor 100. External devices may include IEDs, communication devices, etc. In the illustrated example, the supply rail 922 is powering the auxiliary power terminals 999. In other examples, multiple auxiliary power terminals may be included in the analog sensor 100 each powered by a different one of the available power rails.

For manufacturing and cost reasons it is desirable to make the secondary core 952 and sense core 954 out of the same material. Alternatively, sense core 954 may be made of a material with a higher initial permeability than the secondary core 952. The higher initial permeability provides an advantage when the primary current is low since the reluctance of the sense core 954 may prevent operation at lower primary current levels with lower initial permeability materials. However, the sense core 954 material may have much lower flux handling capability than the other cores since the compensation circuitry 942 maintains the flux in the sense core near zero as previously discussed. An acceptable alternate higher initial permeability sense core 954 material is Magnetic Alloy 2714A manufactured by Honeywell International Metglas® Solutions in Conway, S.C., U.S.A.

As an alternate example, secondary core 952 and secondary coil 932 of active CT 960 can replace the powering CT 949. In this example, the powering CT 949 is removed and the resultant open ends of inductors 901*a* and 901*b* are connected in series with the external burden 930. Also in this example, an isolated DC/DC converter may be installed on the positive rail 926 in switched capacitor circuitry 915 to provide isolated power for the circuitry shown in FIG. 10. In addition, line GP1 can no longer connect directly between the circuitry of FIG. 9 and FIG. 10, and the ground connections 914 of FIG. 9 are isolated from the ground connections of FIG. 10. The arrangement provides for a reduction in the number of magnetic cores, but increases the electronic circuitry complexity and may reduce performance due to the active CT 960 performing two functions.

Microcontroller Operation

Figure 14A:
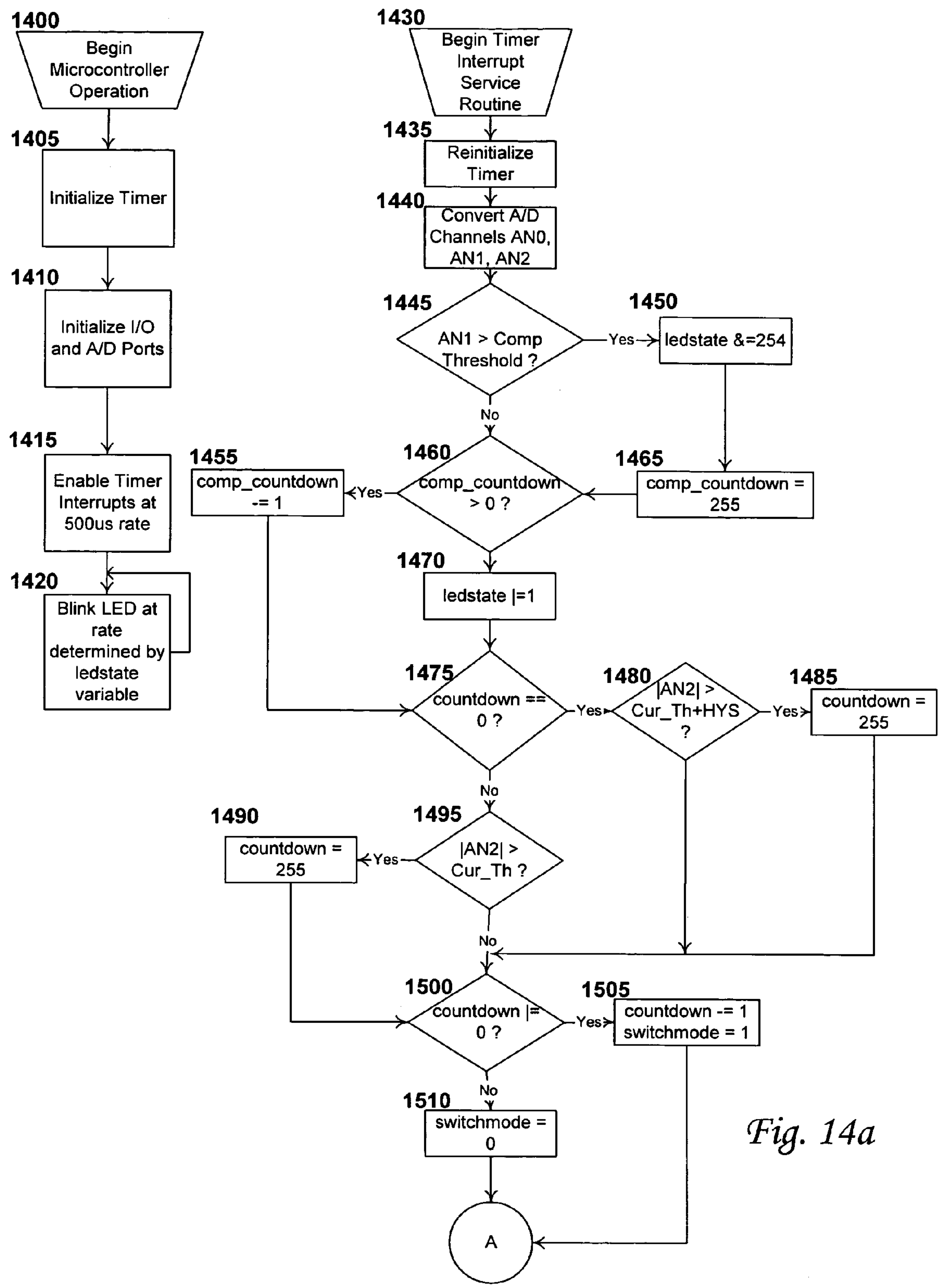
FIGS. 14*a* and 14*b* depict the operation of the code of a microcontroller of the present invention in flow chart form.
Figure 14B:
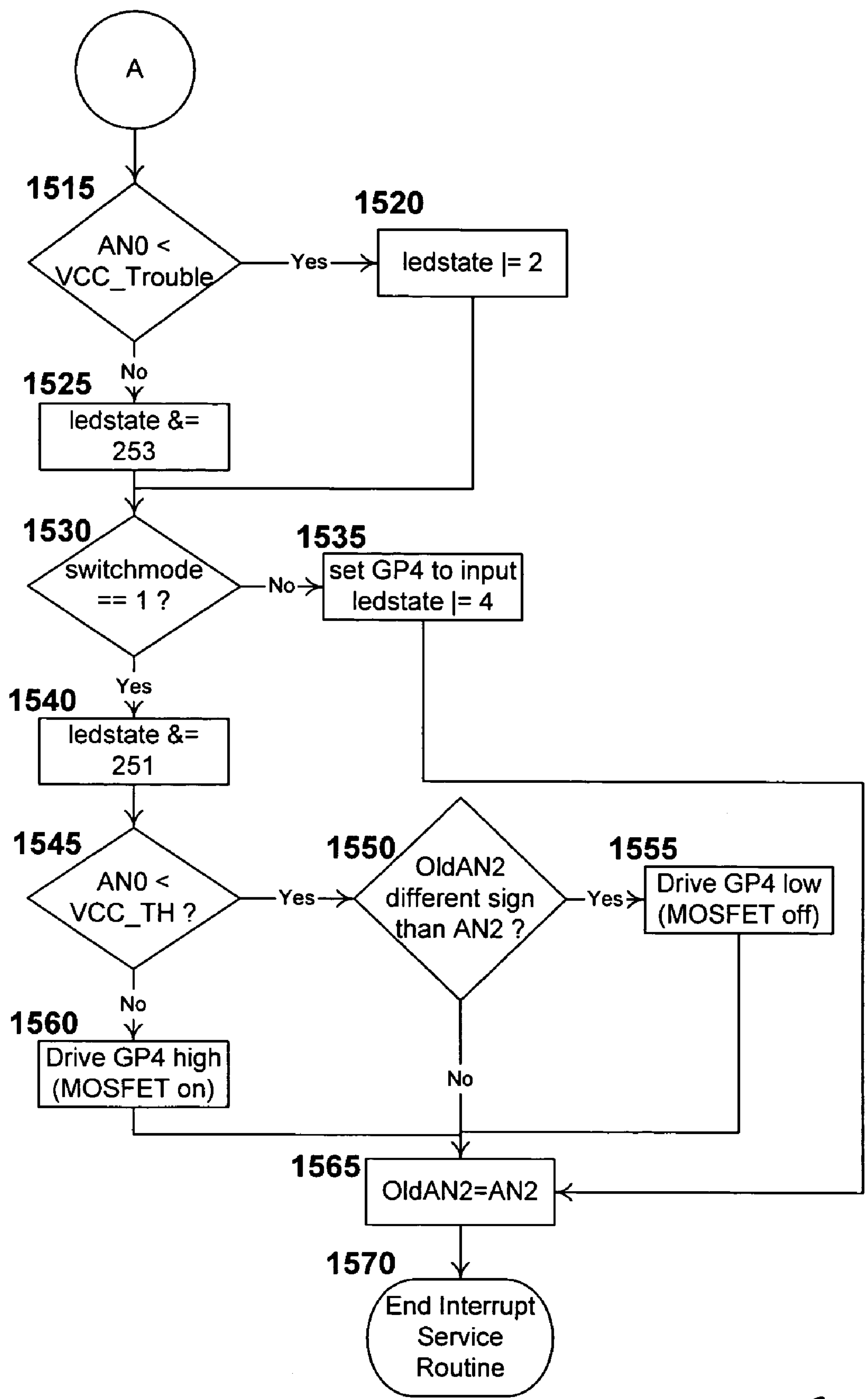

Referring now to FIGS. 14*a* and 14*b*, example operation of the firmware code of microcontroller 911 is shown. When the microcontroller code begins operation (block 1400) an internal timer is initialized (block 1405). The code then initializes I/O and analog to digital converter (A/D) ports (block 1410). The internal timer is initialized to interrupt at a determined rate, such as a 500 microsecond rate (block 1415). The microcontroller 911 then goes into a loop where it blinks the LED 913 connected to the GP5 port at a rate determined by an "ledstate" variable (block 1420). The remainder of the microcontroller 911 functionality is implemented in a timer interrupt service routine.

When the timer interrupt service routine begins (block 1430) the timer is reinitialized to interrupt at the expiration of the determined rate (block 1435). An A/D conversion is performed on the signals present on channels AN0, AN1 and AN2 (block 1440). This provides samples of the state of the supply rail 922 line, the compensation circuitry 942 output, and the current monitoring circuitry 908, respectively. AN0 and AN1 are treated as positive unsigned numbers. AN2 is treated as a signed number (and thus voltages around one half of 3.3VDC input to AN2 result in A/D output values that are large positive or negative numbers for example.)

If AN1 is above a compensation threshold (for example 4.0 volts) this is an indication that the compensation circuitry 942 may not be compensating the active CT 960 properly (block 1445). This may happen if the primary current is too high, the external burden is too large or there is too large of an air gap in one of the cores of the analog sensor 100. In this case, the "ledstate" variable is bitwise ANDed with a determined value, such as 254 to clear the least significant bit (block 1450). This will be detected at block 1420 and the LED 913 will be blinked with a predetermined on/off pattern to indicate to the user that the compensation may not be working properly. Then a "comp_countdown" variable is set to 255 (block 1465). Due to the fact that the output from the compensation amplifier 943 is an AC signal, if a peak over the threshold is detected at block 1445, the "comp_countdown" variable ensures that the "ledstate" variable does not have its least significant bit set until there has been no peak above the compensation threshold for 255 executions of the timer interrupt. This equates to about 7.6 line frequency cycles at 60 Hz or 6.4 line frequency cycles at 50 Hz. If the "comp_countdown" variable is greater than zero (block 1460) execution continues at block 1475. Otherwise, the least significant bit of the "ledstate" variable is set (block 1470).

If a variable "countdown" is zero (block 1475) the absolute value of AN2 is compared to a current threshold minus a hysteresis constant (block 1480). Adjustment of the hysteresis constant changes the response time of the system. If the absolute value of AN2 is less than this amount the variable "countdown" is set to 255 (block 1485). If the variable "countdown" is not equal to zero at block 1475, the absolute value of AN2 is compared to a current threshold without hysteresis (block 1495) and if the absolute value of AN2 is less than this amount, the variable "countdown" is set to 255 (block 1490).

If "countdown" is not equal to zero (block 1500) "countdown" is decremented and a variable "switchmode" is set (block 1505). Otherwise, variable "switchmode" is cleared (block 1510). The function of blocks 1475 to 1510 is to set the variable "switchmode" if the code was in the switched regulation mode previously and the output current from the power coil 900 is still high enough to remain there, or if the code was not in the switched regulation mode, change to the switched regulation mode if the output current has risen to a value equal to the amount required to stay in switched mode plus an amount of hysteresis. The amount of hysteresis may be, for example, 4 A/D counts. Due to the fact that the signal going into AN2 is an AC signal, the "countdown" variable provides for detection of the peak output current in a similar fashion as the "comp_countdown" variable described above. (In this case smaller absolute value of analog to digital conversion results mean larger current flow.)

If AN0 is less than a VCC Trouble threshold (block 1515) this is an indication that the circuitry is unable to keep the supply rail 922 at a high enough level for reliable operation. In this case, the second bit of the "ledstate" variable is set (block 1520) such that the LED 913 can be blinked at a rate indicating to the user that there is a problem (at block 1420).

Otherwise, the second bit of the "ledstate" variable is cleared (block 1525). The supply rail 922 is +5VDC in the illustrated embodiment.

If the "switchmode" variable is set to 1 (block 1530) the analog sensor 100 is in the previously discussed switched regulation mode and the third bit of the "ledstate" variable is cleared (block 1540). AN0 is then compared to a VCC regulation threshold (block 1540). The VCC regulation threshold is set to a determined level such that the ripple in the supply rail 922 is acceptable for operation of the circuitry of the analog sensor 100. If AN0 is not below this threshold, line GP4 is driven high (block 1560) to turn the MOSFET 905 on. When the MOSFET 905 is turned on, most of the current provided from the power coil 900 flows through the MOSFET 905. Otherwise if AN0 is below the VCC regulation threshold, the previous value of AN2 is compared to the present value (block 1550). If the previous value and the present value are different in sign, line GP4 is driven low (block 1555). This turns the MOSFET 905 off and most of the current from the power coil 900 flows through diode 916. If the previous value and present value of AN2 are the same sign, the drive state of line GP4 is not changed. This means that the switching off of MOSFET 905 happens near a zero crossing of the current in the power coil 900 which reduces transients generated on the primary winding 950. Transients may otherwise propagate to the active CT 960, or cause misoperation of test equipment being used by a customer the operation of the analog sensor 100.

At block 1565, the old value of AN2 is recorded for the next entry into the timer interrupt service routine and the timer interrupt service routine terminates (block 1570).

If at block 1530, the switchmode variable is not set to 1, the GP4 input is set to be an input (floating) and the third bit of the ledstate variable is set and execution continues at block 1565. The circuitry of the analog sensor 100 thus enters the linear regulation mode as described previously.

It will be appreciated that the microcontroller 911 is implementing at least one comparison function in the preceding description and therefore, the microcontroller 911 could be at least partially replaced by devices and/or circuits employing a comparator.

Figure 11:
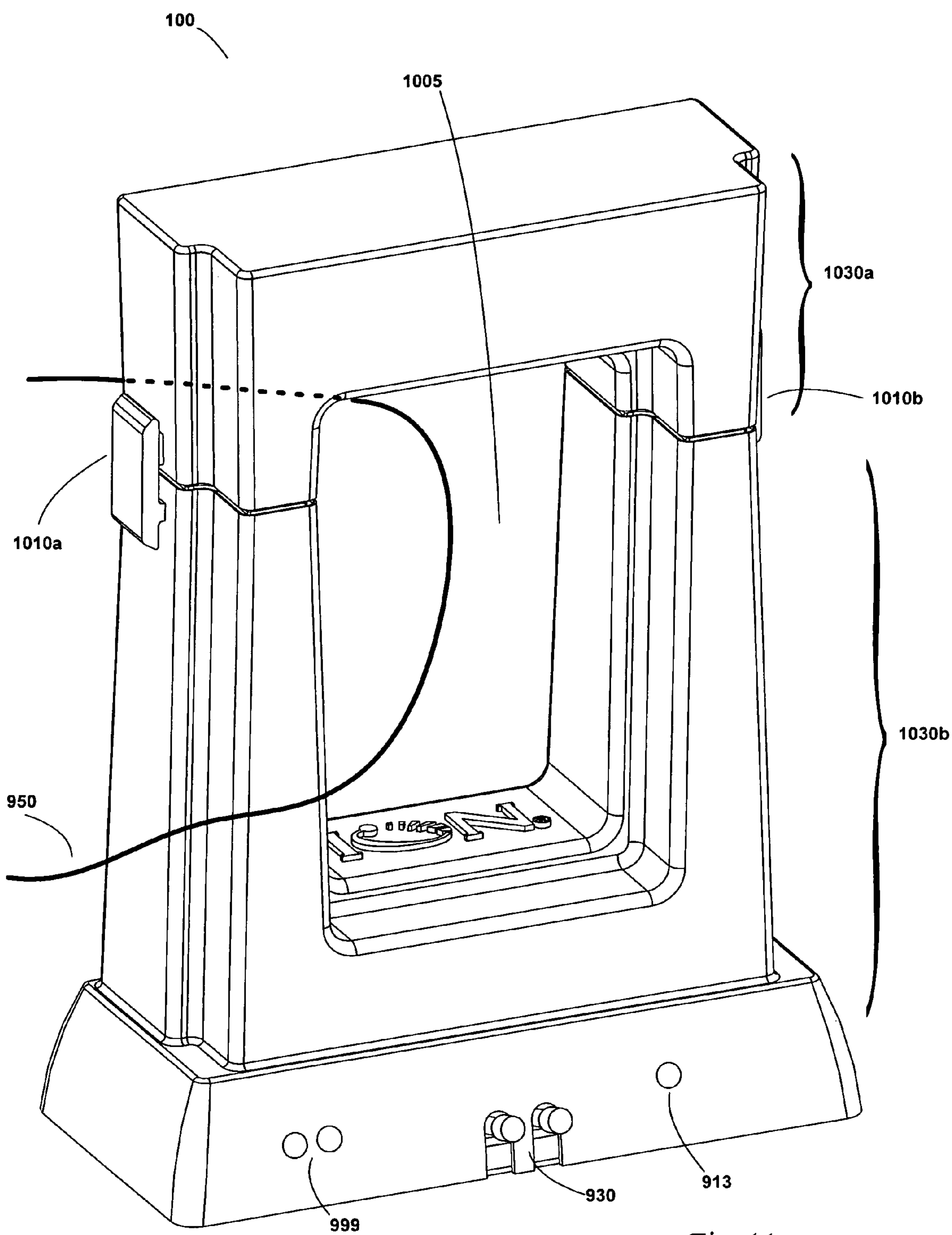
FIG. 11 depicts a perspective view of a first embodiment of the current sensor of the present invention in assembled condition.

Referring now to FIG. 11, a perspective view of an example of the analog sensor 100 in assembled condition is shown. This example of the analog sensor 100 has split cores. The split core allows for routing of the primary winding 950 through a window 1005 without disconnection of the primary winding 950 from the source or load 130. Routing through the window 1005 may be accomplished by first unlatching a first latch 1010*a* and a second latch 1010*b*, and then separating a top half of the enclosure 1030*a* from a bottom half of the enclosure 1030*b*.

In other examples, other forms of split core configurations may be implemented for the analog sensor 100. The primary winding 950 may be positioned within the window 1005. In addition, the top half of and the bottom half 1030*b* may be aligned with each other and the latches 1010*a*, 1010*b* may be re-latched. In the illustrated example, burden terminals 930, auxiliary power terminals 999 and LED 913 are disposed on the bottom portion of the analog sensor 100. In other examples, the burden terminals 930, auxiliary power terminals 999 and LED 913 may be positioned anywhere else on, or near the analog sensor 100. It will be appreciated that the various windings described herein may be wound on bobbins that are then slipped over the appropriate core.

Figure 12:
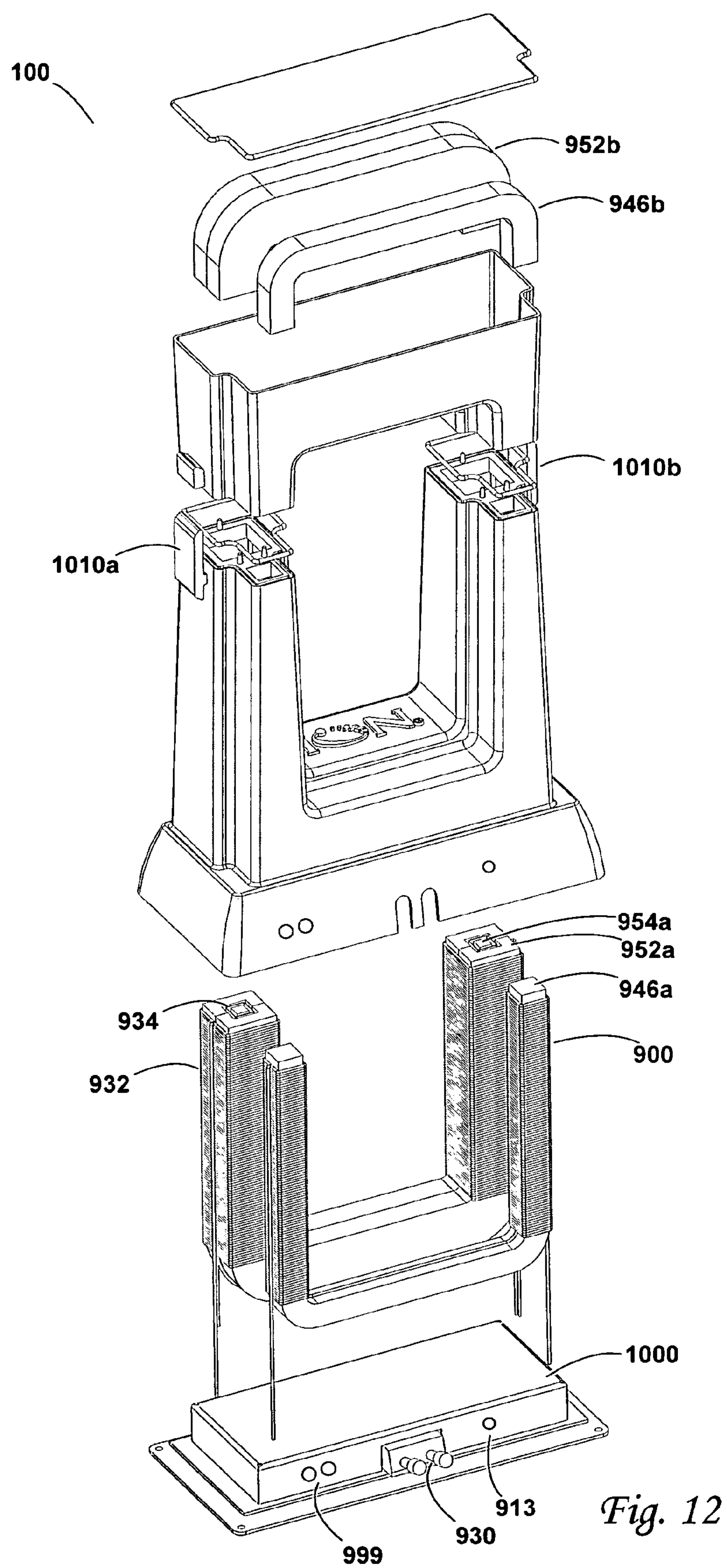
FIG. 12 depicts a perspective view of a first embodiment of the current sensor of the present invention in semi-exploded condition.

Referring now to FIG. 12, a semi-exploded perspective view of the example of the analog sensor 100 depicted in FIG. 11 is shown. Electronics enclosure 1000 houses the electronic circuitry shown in FIGS. 9 and 10. Power core 946, sense core 954 and secondary core 952 are split horizontally (as shown in the diagram) into a first section and a second section, respectively. The first and second sections are illustrated as elements 946*a* and 946*b*, 954*a* and 954*b*, and 952*a* and 952*b*. Power coil 900 may be wound on the first section of the power core 946*a*. Sense coil 934 (more easily visible in FIG. 13) may be wound on the first section of the sense core 954*a*. Secondary coil 932 may be wound on the first section of the secondary core 952*a*. A portion of each of the power coil 900, sense coil 934 and secondary coil 932 enter the electronic enclosure 1000. It will be noted that splitting the analog sensor 100 provides for ease of installation, but may compromise accuracy to some extent (although not nearly to the extent that splitting the core affects the accuracy of standard current transformers due to the active magnetization current replacement employed). Non-split version examples of the present invention are also contemplated.

Figure 13:
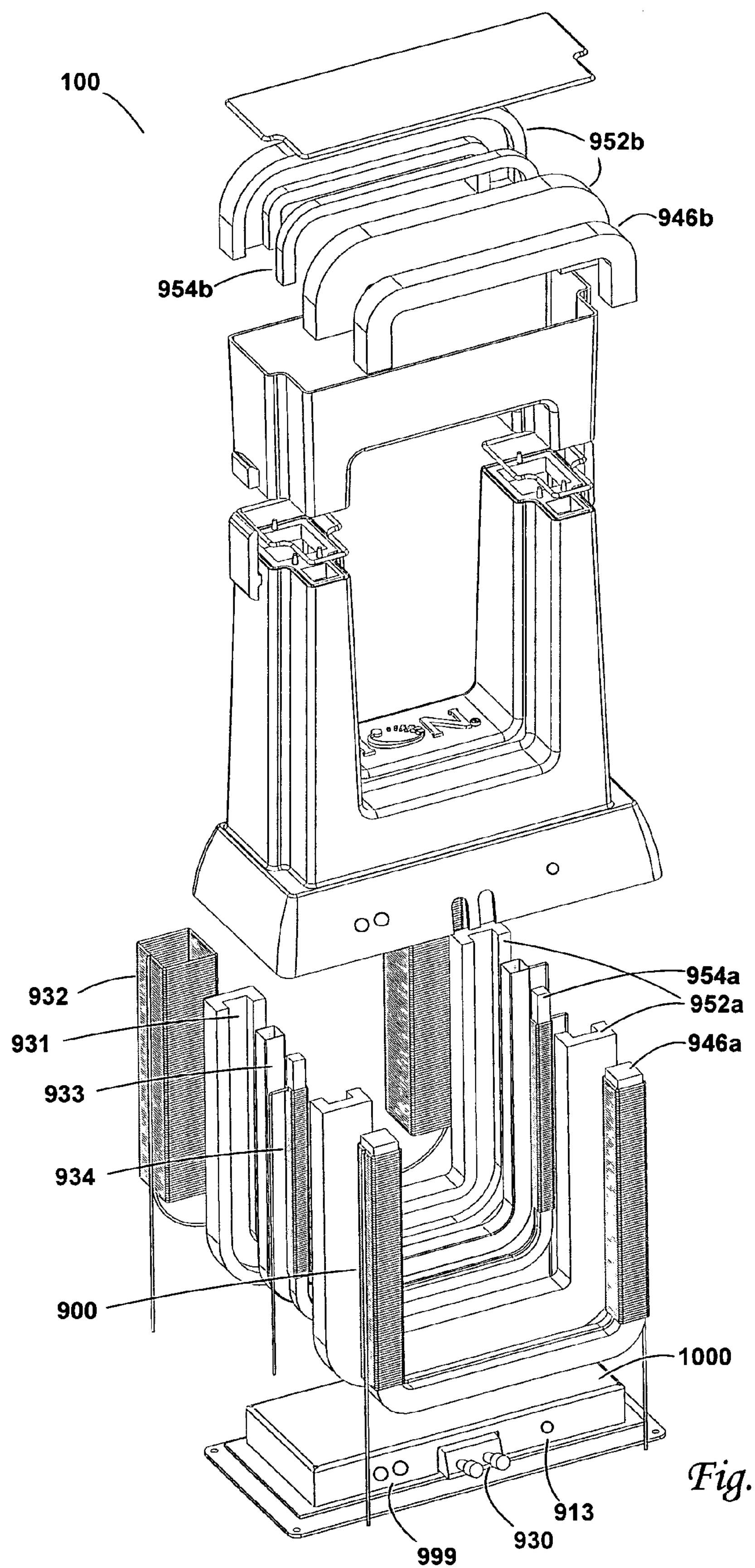
FIG. 13 depicts a perspective view of a first embodiment of the current sensor of the present invention in exploded condition.

Referring now to FIG. 13, a further exploded perspective view of the example analog sensor 100 depicted in FIG. 11 is shown. The first and second sections of the secondary core 952*a*, 952*b* are further split vertically. The first and second sections of the secondary core 952*a*, 952*b* are further split to allow the insertion of the sense coil 934 and sense core 954 within a channel or groove 931 formed within the secondary core 952. The sense coil 934 is wound on the first section of sense core 954*a* before the sense core 954 is inserted within the secondary core 952. The first section of the secondary core 952*a* is then wound with the secondary coil 932. The analog sensor 100 is then assembled, potted with an appropriate potting compound such as type XR6 1470/XHD 1471 manufactured by Crosslink Technology Inc. located in Toronto, Ontario, Canada and then cut to form a top half of the enclosure 1030*a* and bottom half of the enclosure 1030*b*. At least one of the secondary coil 932 and the sense coil 934 may be shielded from extraneous magnetic and/or electric fields with a shield 933. In other examples, other component configurations and/or construction techniques may be used to achieve the functionality of the analog sensor 100.

Figure 15:
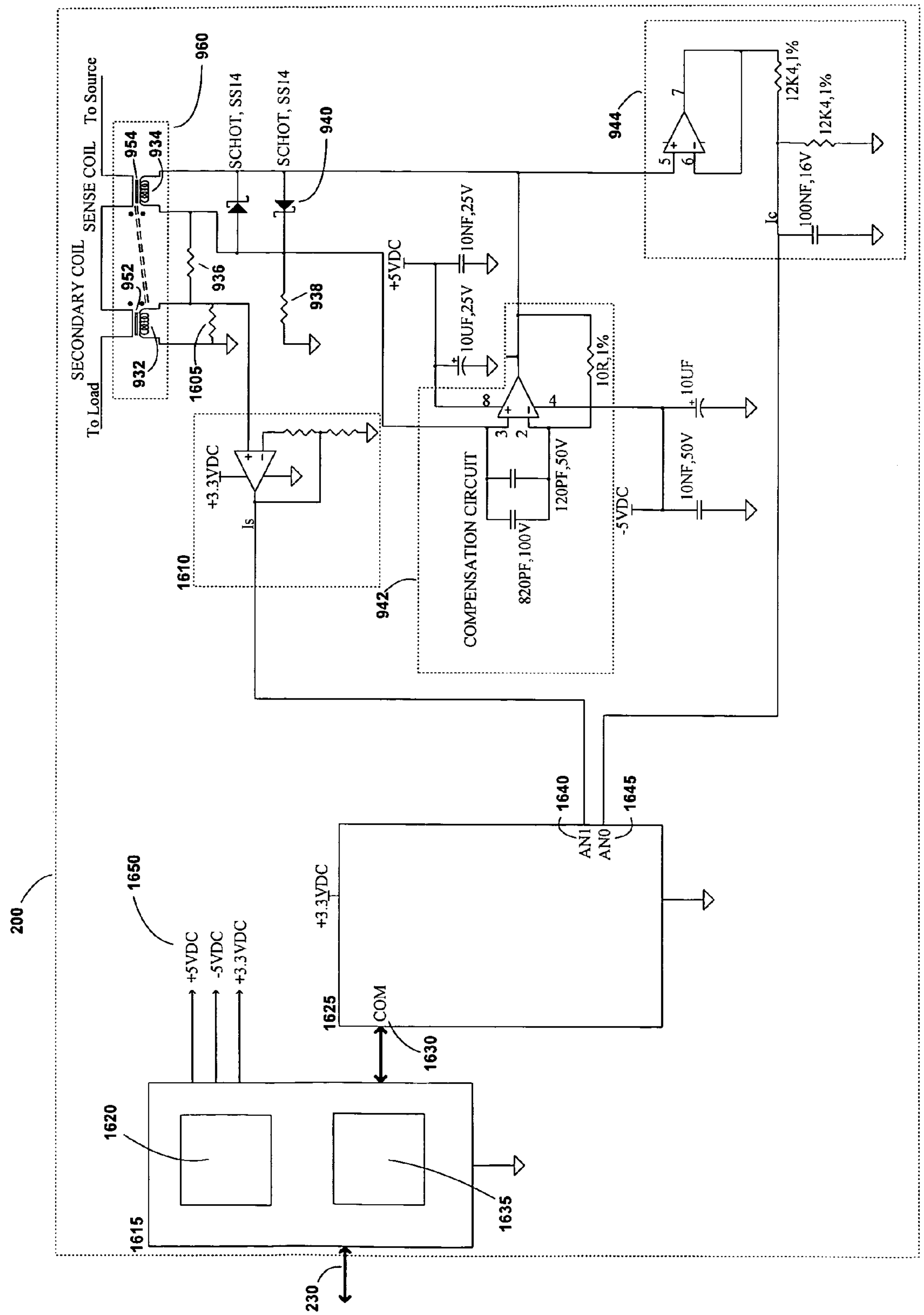
FIG. 15 depicts a schematic diagram of the electronic circuitry of a second embodiment of the current sensor of the present invention.

Referring now to FIG. 15, a schematic diagram of an example of the digital sensor 200 is shown. For purposes of brevity, the remaining discussion will focus on differences with the previously described analog sensor 100 (FIGS. 8 and 9). A burden amplifier 1610 amplifies the voltage dropped across a burden 1605 that is coupled in parallel with the secondary coil 932 of the active CT 960. An amplified voltage signal produced by the burden amplifier 1610 is applied to one analog to digital converter input 1640 of a microcontroller 1625. A second analog to digital converter input 1645 is connected to the output of the compensation overload detection circuitry 944. The microcontroller 1625 samples the amplified voltage signal and transmits the samples through a communications port 1630 to communications cabling 230 via a communications transceiver 1635 that is included in communications interface circuitry 1615. Communications may be performed over the communications cabling 230 according to a standard communication protocol, such as the IEEE 802.3af standard. The communications cabling 230 may also provide power to the digital sensor 200. The power is extracted from the communications cabling 230 by a power supply interface circuitry 1620 included in communication interface circuitry 1615. The power supply interface circuitry 1620 provides various power rails 1650 for operation of the digital sensor 200. If the microcontroller 1625 detects (through analog to digital converter input 1645) that the compensation circuitry 942 is not compensating the active CT 960 completely, the microcontroller 1625 may transmit a message indicative of this fact over communications cabling 230. It will be appreciated that in this example the digital sensor 200 receives power from an IED or other device over communications cabling 230. Alternatively, the digital sensor 200 may be powered from the current flowing in at least one of the power lines 120 in a similar fashion and with similar circuitry as the analog sensor 100.

Figure 16:
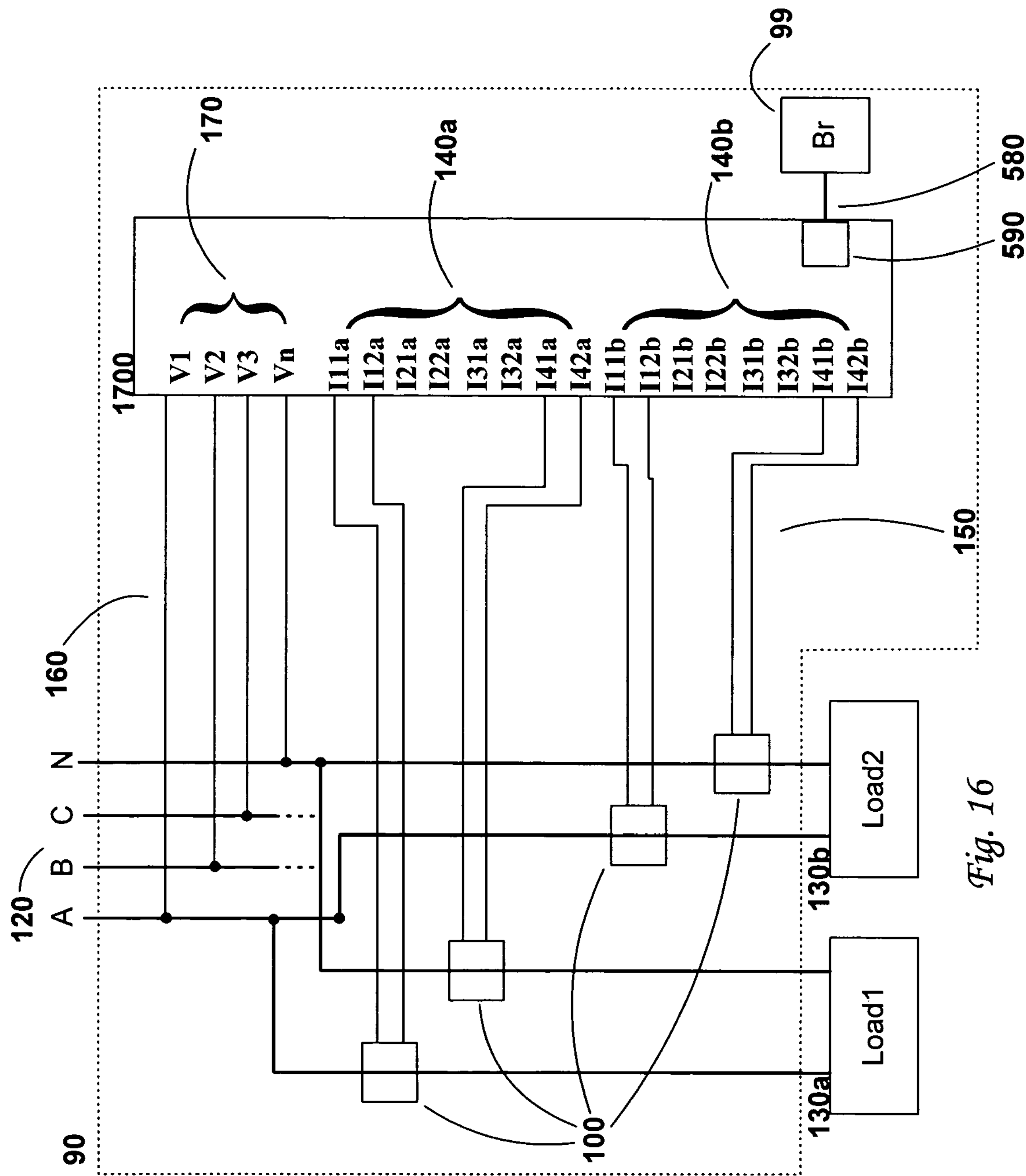
FIG. 16 depicts a block diagram of the first embodiment of the current sensors of the present invention in a fifth embodiment of the power monitoring system of the present invention.

Referring now to FIG. 16, another example of a power monitoring and control system 90 is illustrated. The power monitoring system may include an IED 1700, current conductors 150, voltage conductors 160, analog sensors 100, breaker 99 and I/O lines 580. The IED 1700 of this system comprises at least 2 sets of current inputs 140*a*, 140*b* and at least one set of voltage inputs 170. Otherwise this IED 1700 is similar to the IED 110. The at least 2 sets of current inputs 140*a*, 140*b* allow the IED 1700 to monitor power consumption parameters of at least 2 loads 130*a*, 130*b*. This means that the IED. 1700 can be installed in an electrical cabinet, switchgear enclosure, etc. and monitor multiple loads thus reducing the overall cost of the monitoring and control system. Note that similar systems for monitoring more than one load are possible by adding additional current inputs to the IEDS 110, 210, 310, and 410.

The IED 1700 may be programmed with the impedance of the wiring between where its voltage inputs 170 connect to the power lines 120, and where the analog sensors 100 are located. Since the IED 1700 knows the current that is flowing to each particular load 130*a*, 130*b*, it may determine at least an approximation of the voltage at the load through Ohm's law and calculate power parameters based on the actual voltage seen by the load rather than that seen directly by the IED 1700. This may be an especially valuable configuration for an application such as tenant sub-metering.

The IEDs 110, 210, 310, 410, 1700 in FIGS. 1, 2, 3, 4 and 16 may contain I/O interface circuitry 590 which can control a breaker 99 through I/O lines 580 to switch various loads on and off. This switching may be based on various power parameters being monitored by the IED 1700 that fall outside preset thresholds.

Self Powered Rogowski Coil

As an alternate example, the active CT 960 of the various current sensors described may be replaced with a Rogowski coil. In this case, the circuitry of the sensor can be changed to accept the output of the Rogowski coil and render either an analog or digital representation of the primary current. Rogowski coils have the advantage of non-saturating operation. In this configuration, the powering CT 949 is retained to provide power to the electronic circuitry. The active CT 960 and Rogowski coil are two alternative types of current transducers.

Protocol

It will be noted that the protocol used over the digital or wireless communication links between the sensors and the IEDs may be TCP/IP and may comply with the ITMEL Instrument Transducer-Meter Communication Ethernet Link as defined in the standard of the same name which is hereby incorporated by reference. The determinism and error checking capabilities of IPV6 may be used to ensure timely delivery of current and voltage sample information.

Other protocols that may be supported include Modbus®, DNP, ION, XML, SMTP, DHCP, DNS, HTTP, HTML. The sensors may be self describing using a protocol such as XML. This allows for amplitude/phase correction factors, scales, load curves, phase curves, etc. to be transferred to an IED or computer over communications. This may include calibration curves as described in U.S. Pat. No. 6,671,635 entitled "Systems for Improved Monitoring Accuracy of Intelligent Electronic Devices" which is herein incorporated by reference. The IED or computer may then use this information to improve accuracy.

In addition, the digital sensor 200 (FIG. 2) may communicate to the IED 210 over power line carrier rather than dedicated communication lines.

Also, the wireless sensor 300 (FIG. 3) may transmit and receive at least some communication from communication satellites.

Timesync

It will be noted that an accurate time reference may be needed by the digital sensor 200 and wireless sensors 300 and 400 in order that sample times can be communicated to the appropriate IED with an accurate time reference for the time of the current and/or voltage sample. The digital sensor 200 or wireless sensor 300 and 400 may receive time synchronization with a global positioning system (GPS) receiver, a receiver capable of receiving very low frequency signals such as those from the NIST radio stations WWVB and/or WWVH or through an appropriate communications protocol over a respective communications link. This protocol may comprise the network time (NTP) protocol.

Once an IED has received time synchronized current and/or voltage samples, the IED can rebuild the waveform of the power system voltages/currents and enable functions such as waveform capture, harmonics analysis, sag/swell detection, transient detection, fast Fourier transforms, etc.

Instead of communicating with an IED, the digital sensor 200 and wireless sensors 300 and 400 may communicate directly with a computer. The computer may then emulate at least partially the operation of the IED.

The sensor may be programmed with a fixed TCP/IP, Ethernet or other address. When the sensor is equipped with a GPS receiver, this allows the determination of the location of the sensor. In addition to time synchronization, the sensor may then communicate both its address and location to the IED and/or a computer. This allows for the automatic determination of the location of the sensor. If many sensors are simultaneously installed by a user in multiple locations, the software in the IED and/or computer can automatically determine which data is coming from which location in the power system using the address and the location communicated. The location and/or time synchronization may also be provided to the sensor over a wireless telephone network utilizing control channels, GSM, TDMA, CDMA, CDPD, etc.

If multiple digital sensors 200 or wireless sensors 300 are installed in different locations in a power system, they may be used to perform traveling wave fault detection since each has an accurate time reference. For instance if a fault occurs at one end of a power system, the affect on the waveform of the power signal will propagate through the power system at a given rate. The sensors that are closer to the fault will see the affect on the waveform earlier than those farther away.

IPP Monitoring

Due to the wide dynamic range of the current sensors, they may be used in Independent Power Producer (IPP) monitoring applications. IPPs usually generate a large amount of power (and thus a large current flows through the sensors), but when they are not generating, they consume a much smaller amount of power (perhaps more than an order of magnitude less). Therefore, it is important to accurately measure the current (which is one of the parameters that power is determined from) in both the consumption and generation condition. The wide range of the current sensors allows for revenue accurate monitoring in both conditions. For instance when combined with an accurate IED, the current sensors of the present invention may allow for a determination of a power parameter such as kWh within 0.2% at power factors of 0.8 or lower. This may result in the combination of the accurate IED and the current sensor meeting the accuracy requirement of an international standard such as IEC60687 which normally would not take an external current transformer into account.

Figure 18:
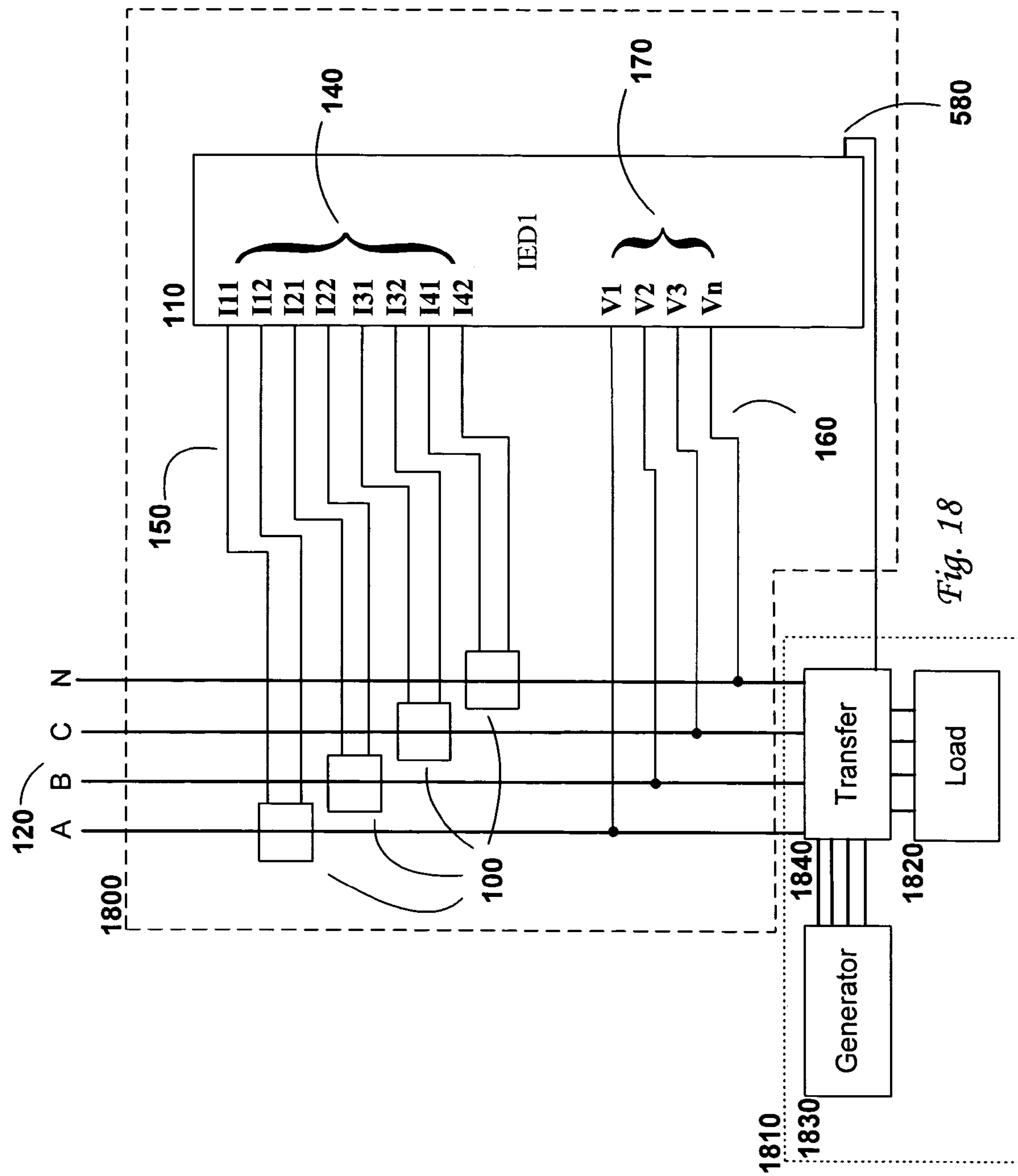
FIG. 18 depicts a block diagram of a power monitoring and control system for an IPP.

Referring now to FIG. 18, a power monitoring and control system 1800 for an IPP 1810 is shown. This system uses the analog sensors 100 and IED 110, but similar systems may be implemented using the digital sensor 200, wireless sensor 300 and IEDs 210, 310 and 410. The IPP has both a load component 1820 and a generation component 1830. A transfer switch 1840 may determine whether the IPP is in generation or consumption condition. The transfer switch 1840 may be controlled by an I/O line 580 of the IED 110.

CVT

The analog sensor 100 may operate as a current to voltage transformer (CVT) if an internal burden is installed across the burden terminals 930. The analog sensor then will provide a voltage output rather than a current output.

Breaker or Protective Relay

The sensor may also function as a circuit breaker or protective relay with the addition of circuit opening device or relaying circuitry that is controlled by the microcontroller 1625. The microcontroller 1625 may execute protective relaying algorithms such as $I^2T$ and interrupt the flow of electricity if a threshold is exceeded.

Hybrid Device

Any or all of the functionality of the IEDs 110, 210, 1700 may be integrated into the current sensor or voltage sensor to provide a hybrid unit capable of calculating power parameters. As described earlier, the current and/or voltage sensors may be combined to provide a single unit capable of calculating power parameters such as kVA, kWh, etc. for at least one phase of the power system.

Switchyard

The current sensors may be used in a switchyard application on medium voltage or high voltage transmission lines. In this case it may be necessary for the physical shape of the sensor to be substantially circular or spherical to prevent corona discharge. The wireless sensor 300 may be especially advantageous in this application due to the fact that there is no physical connection between it and the IED or computer it is communicating with.

Alternate Powering Arrangements

IED 110 may alternately supply power to analog sensor 100 by multiplexing a higher frequency (eg., 500 kHz) signal onto current conductors 150. The energy at this higher frequency may be extracted by the analog sensor 100. The lower frequency (eg., 50 or 60 Hz) signal from the analog sensor 100 is extracted from the current conductors 150 by the IED 110 using appropriate filtering.

Figure 17:
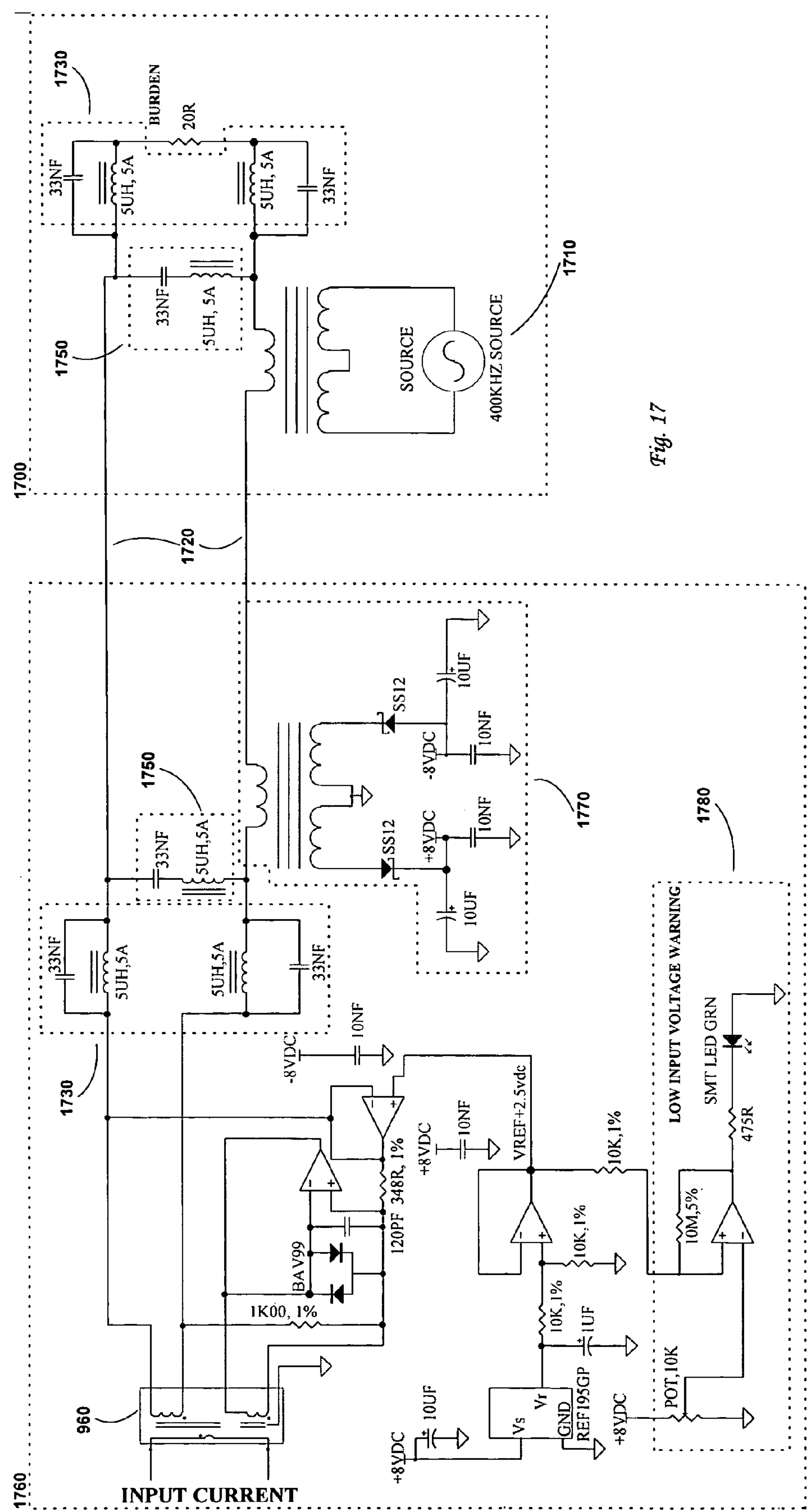
FIG. 17 depicts a schematic diagram of an example power supply circuit for the first embodiment of the current sensor.

An example of this method of powering the analog sensor is shown in the example circuit schematic illustrated in FIG. 17. IED end circuitry 1700 may be-integrated into IED 110 or be provided as a separate device (without the burden). IED end circuitry 1700 multiplexes power from a higher frequency source such as 400 kHz source 1710 onto lines 1720. Appropriate filtering circuitry 1730 is provided to block the higher frequency signal from burden 1740 and high frequency bypass circuitry 1750 provides a path for current at the higher frequency to flow. Sensor end circuitry 1760 extracts power from the high frequency current flowing in lines 1720 using power extraction circuitry 1770.

Sensor end circuitry 1760 contains appropriate filtering circuitry 1730 and high frequency bypass circuitry 1750 similar to that in WED end circuitry 1700. Low input voltage warning circuitry 1780 is provided to warn a user if sufficient voltage is not available in sensor end circuitry 1760. This may be due to lines 1720 being too long, having too much inductance, etc. The remainder of the circuitry of sensor end circuitry 1760 includes an active CT 960 and support circuitry similar to that previously described. It will be noted that filtering circuitry 1730 will pass current at frequencies substantially within a first range (eg. below 4 kHz) while the high frequency bypass circuitry 1750 will pass current at frequencies substantially within a second range (eg. above 400 kHz). The power extraction circuitry 1770 will extract power at frequencies substantially within the second range.

IED 210 may alternately supply power to digital sensor 200 if current communications cabling 230 is fiber optic cable by injecting optical power at the IED 210 end of the cable. The digital sensor 200 then uses appropriate photovoltaic detection circuitry to extract operating power from the optical power injected.

Wireless sensor 300 may alternately be supplied power by an appropriate microwave power transmitter. The wireless sensor 300 then may have a microwave power receiver to receive this power.

It is intended that the foregoing detailed description be regarded as illustrative rather than limiting, and that it be understood that it is the following claims, including all equivalents, that are intended to define the spirit and scope of this invention.

We claim:

1. An apparatus for sensing the current in a power line of a power system, the apparatus comprising:

an active current transformer that includes a secondary coil wound on a secondary core, wherein the secondary core is operable to be magnetized with a power line and the secondary coil is operable to supply a load;

a compensation circuit operable to compensate for magnetic losses in the secondary core;

a power supply circuit having a supply rail, wherein the power supply circuit is operable to regulate the supply rail in one of a switched regulation mode and linear regulation mode to supply power to the compensation circuit from the supply rail; and a powering current transformer that includes a power coil wound on a power core, wherein the power core is operable to be magnetized with the power line and the supply rail is powered from the power coil.

2. The apparatus of claim 1, further comprising a microprocessor and a regulator, wherein the microprocessor is operable to regulate voltage on the supply rail in the switched regulation mode and the regulator is operable to regulate voltage on the supply rail in the linear regulation mode.

3. The apparatus of claim 1, wherein the power supply circuit comprises a shunt switch coupled between a ground connection and the supply rail, the shunt switch selectable to be one of open and closed during the switched regulation mode, and the conductivity of the shunt switch operable to be dynamically modulated during the linear regulation mode.

4. The apparatus of claim 1, wherein the power supply circuit comprises a first switch and a second switch coupled with the supply rail, the first switch selectively enabled to provide a conductive path to ground and the second switch selectively enabled to conduct when a voltage at the first switch is greater than a voltage of the supply rail.

5. The apparatus of claim 1, wherein the power supply circuit comprises an energy storage device coupled with the supply rail, the energy storage device operable to selectively receive a charging current to maintain a determined voltage on the supply rail.

6. The apparatus of claim 1, further comprising a microprocessor and a compensation overload detection circuit powered from the supply rail, wherein the compensation overload detection circuit is operable to provide the microprocessor an indication when the compensation circuit is no longer compensating for all of the magnetization losses in the secondary core.

7. The apparatus of claim 1, wherein the active current transformer comprises a sense coil wound on a sense core, wherein the secondary coil is wound around both the secondary core and the sense core, and the sense core is magnetized by the power line and is operable to induce a sense current in the sense coil, and wherein the compensation circuit is operable to generate a compensation current to maintain the voltage across the sense coil at about zero volts.

8. The apparatus of claim 7, further comprising a current divider coupled with the sense coil and the secondary coil, wherein the current divider is operable to balance the compensation current.

9. The apparatus of claim 1, further comprising a current monitoring circuit that includes a secondary coil sensing current transformer coupled with the power coil, the current monitoring circuit operable to generate a voltage representative of the output current.

10. The apparatus of claim 1, further comprising an auxiliary power terminal, wherein the supply rail is operable to supply power to the auxiliary power terminal for use external to the apparatus.

11. An apparatus for sensing the current in a power line of a power system, the apparatus comprising:

a power current transformer that includes a power coil wound around a power core, the power core operable to be magnetized by a power line to produce an output current from the power coil;

a power amplifier circuit that includes an energy storage device and a shunt switch coupled with the power coil; wherein the shunt switch is selectively operable to shunt at least a portion of the output current to ground to maintain a determined voltage at the energy storage device; and an active current transformer that includes a secondary coil wound on a secondary core, wherein the secondary coil is operable to supply a burden and the secondary core is operable to be magnetized with the power line.

12. The apparatus of claim 11, further comprising a compensation circuit coupled with secondary coil and the energy storage device, wherein the compensation circuit is powered by the energy storage device and is operable to compensate for magnetic losses in the secondary core.

13. The apparatus of claim 11, further comprising a bridge rectifier coupled between the power coil and the power amplifier circuit, the bridge rectifier operable to rectify the output current.

14. The apparatus of claim 11, wherein the power amplifier circuit comprises a microprocessor and a linear regulator, the microprocessor operable to monitor the output current and to select between switch mode regulation of the energy storage device with the microprocessor and linear regulation of the energy storage device with the regulator as a function of the output current.

15. The apparatus of claim 11, wherein the power amplifier circuit comprises a one way switch, the one way switch operable to conduct only when the voltage at the energy storage device is less than the voltage at the shunt switch.

16. The apparatus of claim 11, further comprising a switched capacitor circuit coupled with the energy storage device, wherein the switched capacitor circuit is operable to generate a predetermined negative voltage on a negative rail and a predetermined positive voltage on a positive rail from the determined voltage of the energy storage device.

17. The apparatus of claim 11, wherein the shunt switch comprises a semiconductor device and the energy storage device comprises a capacitor.

18. The apparatus of claim 11, further comprising an auxiliary power terminal, wherein the energy storage device is operable to supply power to the auxiliary power terminal for use external to the apparatus.

* * * * *